United States Patent
Tanaka et al.

(10) Patent No.: US 7,902,716 B2
(45) Date of Patent: Mar. 8, 2011

(54) SURFACE ACOUSTIC WAVE DEVICE AND COMMUNICATION APPARATUS

(75) Inventors: Hiroyuki Tanaka, Kyoto (JP); Tsuyoshi Nakai, Kyoto (JP); Kiyohiro Iioka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 252 days.

(21) Appl. No.: 12/091,283

(22) PCT Filed: Oct. 27, 2006

(86) PCT No.: PCT/JP2006/321526
§ 371 (c)(1),
(2), (4) Date: Apr. 23, 2008

(87) PCT Pub. No.: WO2007/049754
PCT Pub. Date: May 3, 2007

(65) Prior Publication Data
US 2009/0116340 A1  May 7, 2009

(30) Foreign Application Priority Data
Oct. 27, 2005 (JP) ............................... 2005-312702
Jan. 26, 2006 (JP) ............................... 2006-017648

(51) Int. Cl.
*H01L 41/08* (2006.01)
(52) U.S. Cl. ............. 310/313 D; 310/313 B; 310/313 C
(58) Field of Classification Search ............. 310/313 R, 310/313 D; 333/193, 195
See application file for complete search history.

(56) References Cited

U.S. PATENT DOCUMENTS

| 6,744,333 | B2 * | 6/2004 | Sawada ..................... 333/133 |
| 6,781,485 | B2 * | 8/2004 | Takamine et al. ........... 333/195 |
| 7,528,683 | B2 * | 5/2009 | Shibahara et al. .......... 333/193 |
| 7,579,928 | B2 * | 8/2009 | Otsuka et al. ............... 333/133 |
| 2003/0042999 | A1 | 3/2003 | Takamine et al. |
| 2003/0137365 | A1 | 7/2003 | Takamine .................... 333/133 |
| 2004/0108918 | A1 | 6/2004 | Tsunekawa et al. ......... 333/195 |

(Continued)

FOREIGN PATENT DOCUMENTS
CN    1441551 A    9/2009
(Continued)

OTHER PUBLICATIONS

Chinese language office action and its English language translation for corresponding Chinese application 200680039438.4 lists the references above.

(Continued)

*Primary Examiner* — Mark Budd
(74) *Attorney, Agent, or Firm* — DLA Piper LLP (US)

(57) ABSTRACT

To provide a surface elastic wave apparatus that suppresses occurrence of fine ripples within a pass band, improves insertion loss and enhances the degree of balance. First and second surface acoustic wave elements (14, 15) that are parallel-connected to a surface acoustic wave resonator (16) respectively have three or more odd-numbered IDTs (2-4, 5-7), each having a plurality of electrode fingers placed along a propagation direction of a surface acoustic wave that is propagated over a piezoelectric substrate (1), and reflectors (8, 20, 21, 10), each having a plurality of electrode fingers that are placed on the two ends of the IDT row, and among all the electrode fingers respectively possessed by the IDTs and reflectors, the polarities of the electrode fingers placed adjacent to a different IDT or reflector are arranged symmetrically centered on the IDT located in the center.

8 Claims, 13 Drawing Sheets

U.S. PATENT DOCUMENTS

| | | |
|---|---|---|
| 2004/0207491 A1 | 10/2004 | Nakaya et al. ................. 333/195 |
| 2005/0001696 A1 | 1/2005 | Otsuka et al. ................. 333/133 |
| 2007/0024397 A1 | 2/2007 | Otsuka et al. |

FOREIGN PATENT DOCUMENTS

| | | |
|---|---|---|
| DE | 19818038 A1 | 11/1999 |
| JP | 11-097966 | 4/1999 |
| JP | 2002-009587 | 1/2002 |
| JP | 2002-084164 | 3/2002 |
| JP | 2003069383 A | 3/2003 |
| JP | 2004-304513 | 10/2004 |
| JP | 2005-039811 | 2/2005 |
| JP | 2006333171 A | 12/2006 |

OTHER PUBLICATIONS

Japanese language office action dated Jul. 13, 2010 and its English language translation for corresponding Japanese application 2003283290 lists the reference above.

\* cited by examiner

FIG. 5
(a)
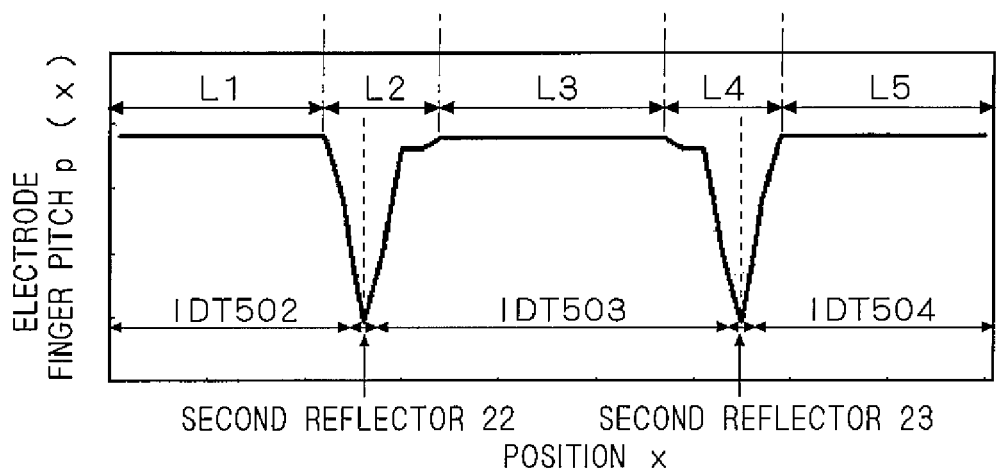
(b)
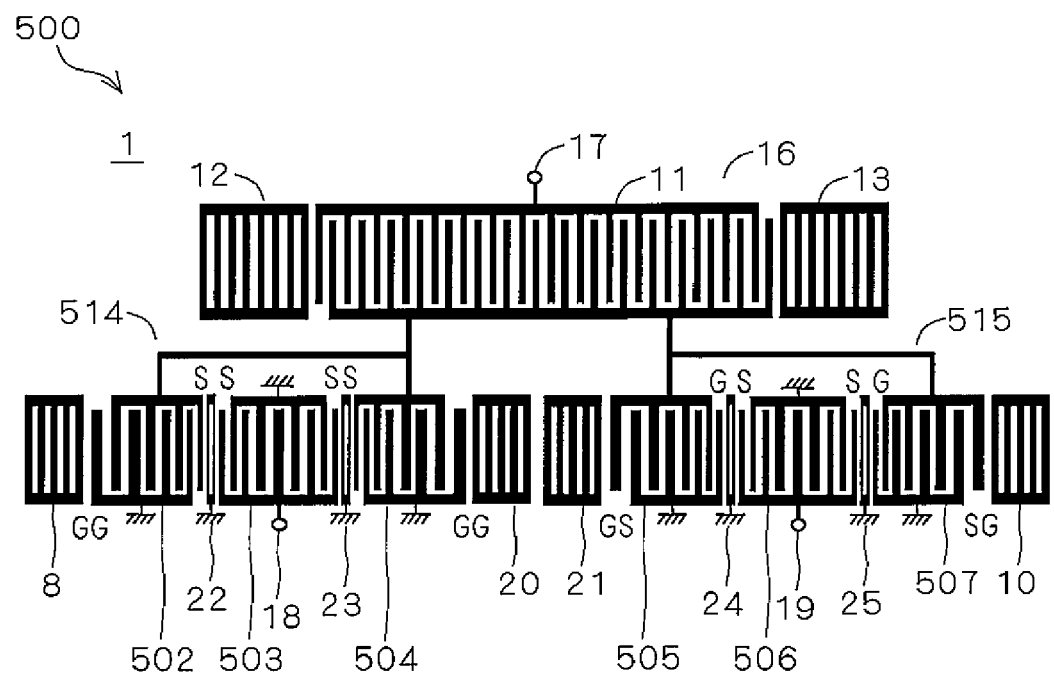

FIG. 6
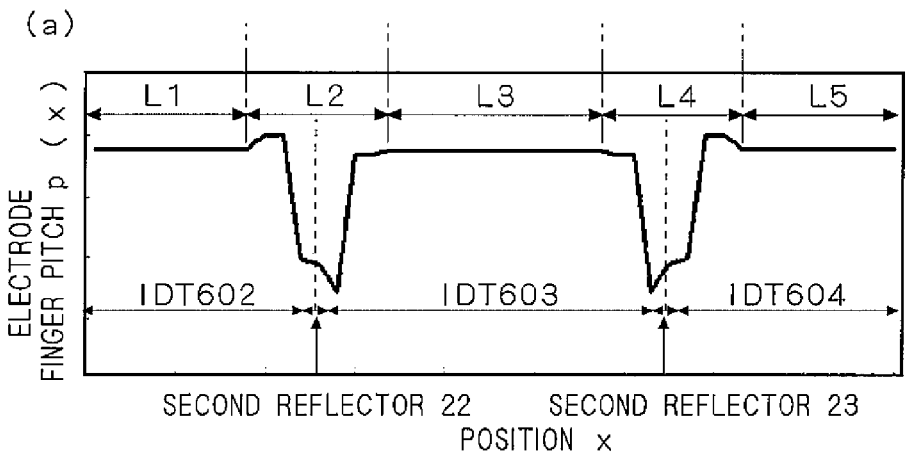
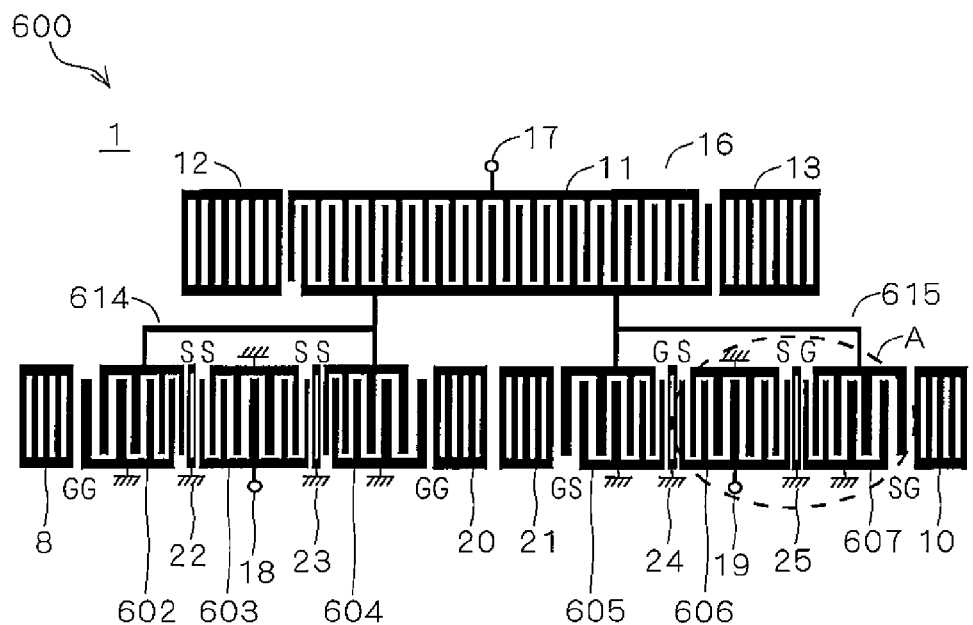
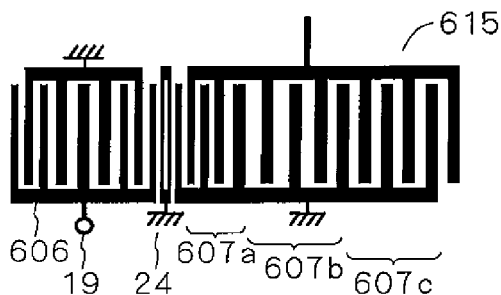

FIG. 9
(a)
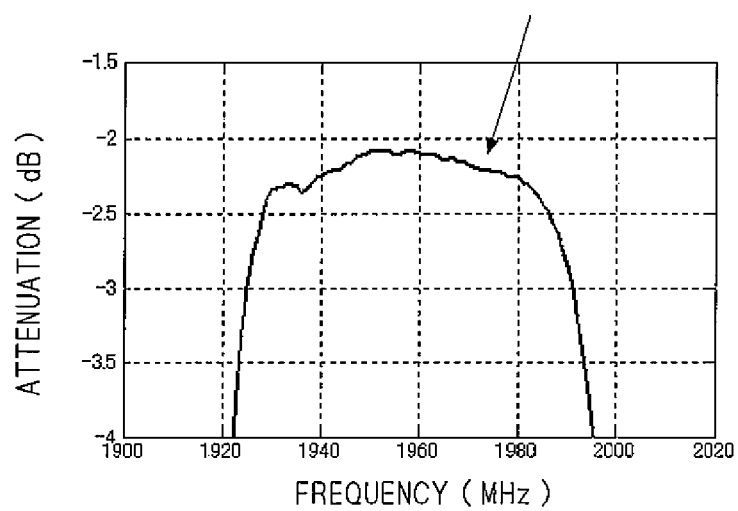
(b)
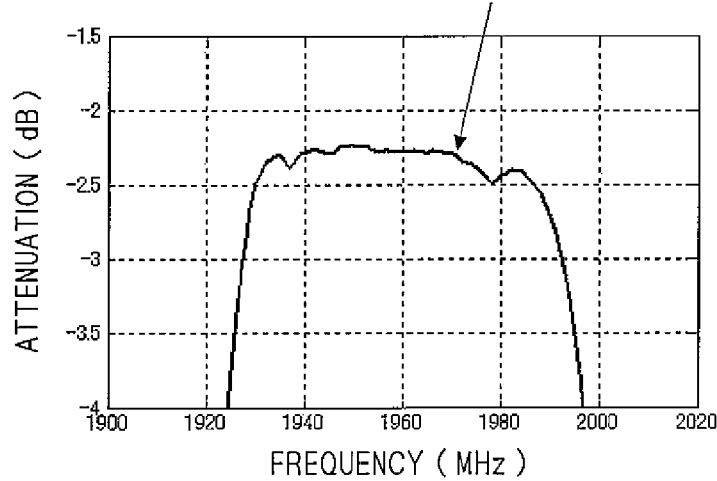

FIG. 10
(a)
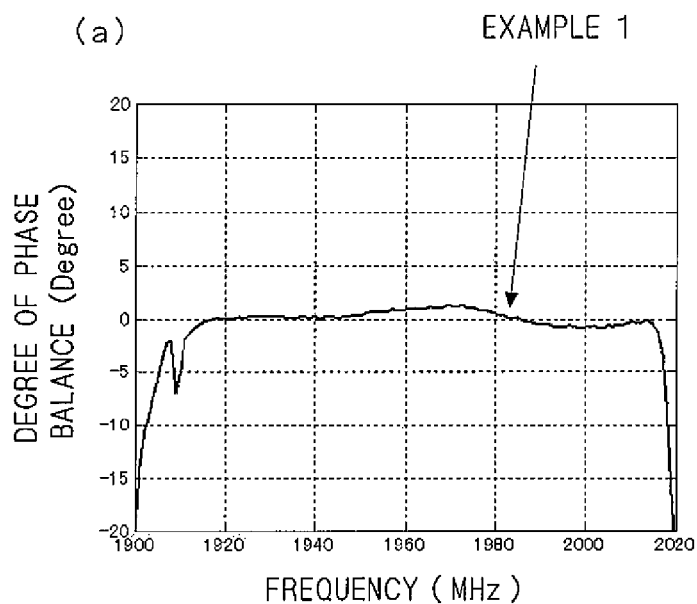
EXAMPLE 1
(b)
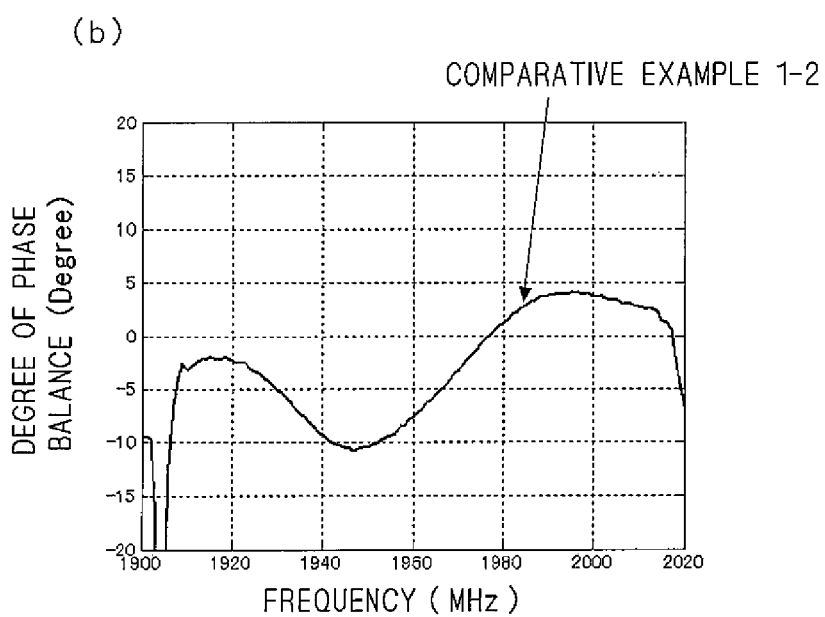
COMPARATIVE EXAMPLE 1-2

F I G . 1 1
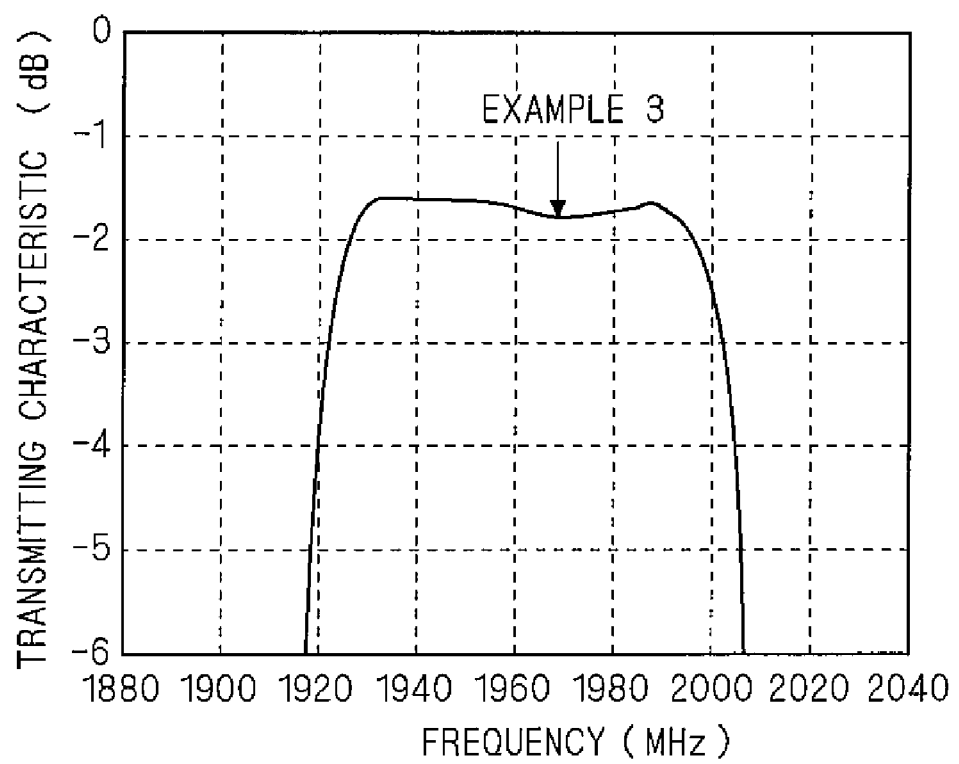

FIG. 12
(a)
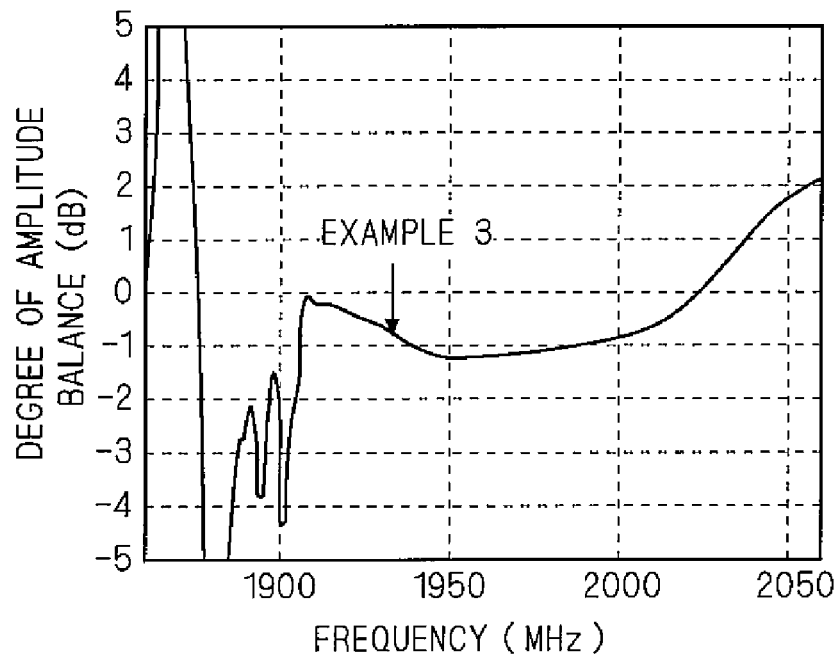
(b)
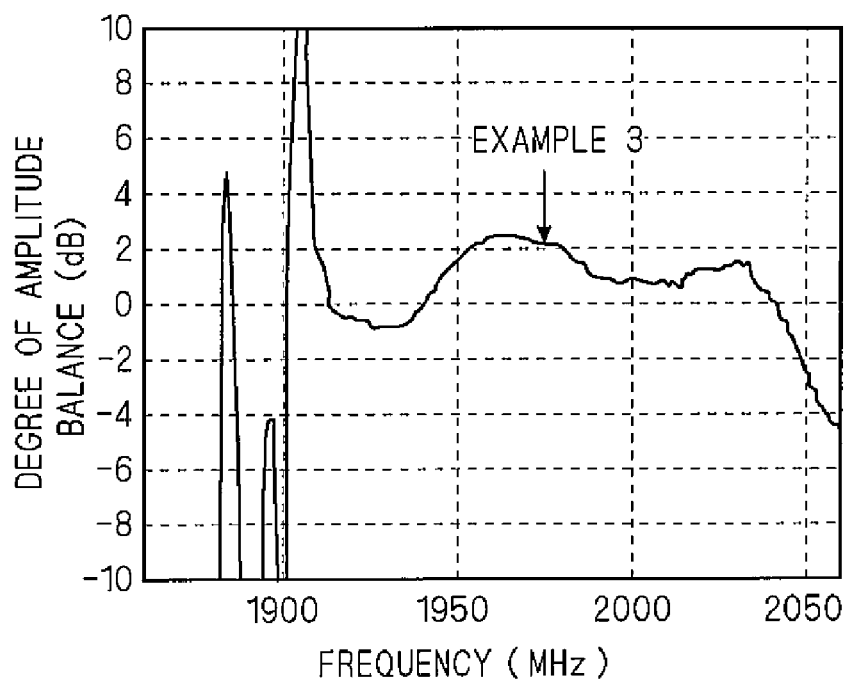

SURFACE ACOUSTIC WAVE DEVICE AND COMMUNICATION APPARATUS

CROSS-REFERENCE TO THE RELATED APPLICATIONS

This application is a national stage of international application No. PCT/JP2006/321526 filed on Oct. 27, 2006, which also claims benefit of priority under 35 U.S.C. §119 to Japanese Patent Application No. 2005-312702 filed on Oct. 27, 2005 and Japanese Patent Application No. 2006-017648 filed on Jan. 26, 2006, the entire contents of all of which are incorporated by reference.

FIELD OF THE INVENTION

The present invention relates to a surface acoustic wave device such as a surface acoustic wave filter and a surface acoustic wave resonator to be used for a mobile communication apparatus such as a mobile telephone, and also concerns a communication apparatus provided with such a surface acoustic wave device.

BACKGROUND OF THE INVENTION

Conventionally, surface acoustic wave filters have been widely used as frequency selection filters (hereinafter, referred to also as "filter") to be used for the RF (radio frequency) stage of mobile communication apparatuses such as mobile telephones and automobile telephones. In general, desired characteristics required for the frequency selection filter are a wider pass band, a lower loss and a higher attenuation. In recent years, there have been strong demands for a lower insertion loss in a surface acoustic wave filter so as to further improve the receiving sensitivity and achieve lower power consumption in a mobile communication apparatus. Moreover, recently, built-in antennas using dielectric ceramics or the like have come to be used in place of conventional whip antennas so as to achieve a smaller size of the mobile communication apparatus. For this reason, it becomes difficult to obtain a sufficient gain in the antenna, and from this point of view also, there have been stronger demands for further improving the insertion loss of a surface acoustic wave filter.

In order to achieve such a wider band pass and lower insertion loss, a double mode surface acoustic wave resonator filter has been proposed in which, for example, three IDTs (Inter Digital Transducer) are installed on a piezoelectric substrate so that longitudinal primary mode and longitudinal tertiary mode are utilized.

In particular, an arrangement has been proposed in which by placing narrow pitch portions of electrode fingers on end portions of adjacent IDTs, radiation loss of bulk wave among IDTs is reduced to control the state of the resonance mode so that a wider pass band and a lower insertion loss are achieved (for example, see JP-A No. 2002-9587).

Moreover, in recent years, the number of applied parts has been cut in order to achieve small size, light weight and low cost of a mobile communication apparatus and the like, and there have been demands for adding new functions to a surface acoustic wave filter. One of the demands is to achieve a construction of an unbalanced input/balanced output type or a balanced input/unbalanced output type. Here, the balanced input or the balanced output refers to a construction in which a signal is inputted or outputted as a potential difference between two signal line paths, and the signals of the respective signal line paths have the same amplitude and opposite phases. In contrast, the unbalanced input or the unbalanced output refers to a construction in which a signal is inputted or outputted as a potential of one line path relative to the ground potential.

In general, a conventional surface acoustic wave filter is an unbalanced input/unbalanced output type surface acoustic wave filter (hereinafter, referred to as an unbalanced type surface acoustic wave filter); therefore, when a circuit or an electronic part of a balanced input type is connected to the succeeding stage of the surface acoustic wave filter, a circuit construction in which an unbalance/balance converter (hereinafter, referred to as "balun") is interpolated between the surface acoustic wave filter and the circuit or the like on the succeeding stage has been adopted. In the same manner, when a circuit or an electronic part of a balanced output type is placed on the preceding stage of the surface acoustic wave filter, a circuit construction in which a balun is interpolated between the circuit or the like on the preceding stage and the surface acoustic wave filter has been adopted.

At present, in order to eliminate the balun, an unbalanced input/balanced output type surface acoustic wave filter or a balanced input/unbalanced output type surface acoustic wave filter (hereinafter, referred to as a balanced type surface acoustic wave filter), which allows a surface acoustic wave filter to have an unbalance/balance conversion function or a balance/unbalance conversion function, has been developed for practical use. In order to satisfy the demands for the unbalance/balance conversion function, a longitudinal coupling type double mode filter has been widely used. Moreover, with respect to the RF filter, those filters having one of the connection terminals unbalance-connected with its input/output impedance matching 50Ω, while the other is balance-connected, with its input/output impedance matching 100 to 200Ω, are required in most cases.

FIG. 17 is a plan view that schematically shows an electrode structure of a surface acoustic wave device 1000 serving as a conventional surface acoustic wave filter having the balance/unbalance conversion function. In the surface acoustic wave device 1000, a surface acoustic wave element 1012 and a surface acoustic wave element 1013 are placed on a piezoelectric substrate 1001. The surface acoustic wave element 1012 is configured by three IDTs 1002, 1003 and 1004 and reflectors 1008 and 1009 that are placed on the two sides thereof. The surface acoustic wave element 1013 is configured by three IDTs 1005, 1006 and 1007 and reflectors 1010 and 1011 that are placed on the two sides thereof.

The surface acoustic wave element 1012 and the surface acoustic wave element 1013 are parallel-connected to an unbalanced signal terminal 1014. Upon application of an electric field to the mutually opposing comb-shaped electrodes, each of the IDTs 1002, 1004, 1005 and 1007 is allowed to excite a surface acoustic wave. The surface acoustic wave thus excited is propagated to the IDT 1003 in the center of the surface acoustic wave element 1012 and the IDT 1006 of the surface acoustic wave element 1013. Here, the phase of the IDT 1003 forms a opposite phase different from the phase of the IDT 1006 by 1800, and the signal is finally transmitted from one of the comb-shaped electrodes of the IDT 1003 and 1006 to the balanced output signal terminals 1015 and 1016, and balance-outputted. With this structure, the balance/unbalance conversion function can be achieved.

FIG. 18 is a plan view that schematically shows an electrode structure of another conventional surface acoustic wave device 2000. As shown in FIG. 18, in the surface acoustic wave device 2000, with respect to a longitudinal coupling double mode filter on the first stage (on the upper stage side in the Figure) having three IDTs 2002, 2003 and 2004 sandwiched by reflectors 2010 and 2011 on both of the sides, an unbalanced terminal 2021 is connected to the IDT 2003 in the center, and the IDTs 2002 and 2004 on the two sides are respectively longitudinally connected to IDT 2005 and IDT 2007 on the second stage. Moreover, an IDT 2006 in the center of the second stage (on the lower stage side in the Figure) is divided into two, and respectively connected to balanced signal terminals 2022 and 2023 with inverted phases. Thus, it is possible to achieve a balance/unbalance conversion function (for example, see JP-A No. 11-97966).

Moreover, with respect to a surface acoustic wave filter of a resonator type using a conventional longitudinal coupling double mode filter, a structure has been proposed in which among three IDTs placed side by side along a propagation direction of a surface acoustic wave, the IDT placed in the middle is allowed to have an even number of pairs of electrode fingers, with the polarities of adjacent electrode fingers being inverted to each other, so as to improve the degree of balance between the amplitude and the phase (for example, see JP-A No. 2002-84164). Here, with respect to the degree of balance of the amplitude and of the phase, in the case when a signal is inputted or outputted as a potential difference between two signal line paths, as the sizes of the amplitudes of signals between the respective signal line paths become closer to each other, it is said that the degree of balance of the amplitude becomes more superior, and as the difference in the phases of the respective signals becomes closer to 180°, it is said that the degree of balance of the phase becomes more superior.

By using a conventional surface acoustic wave filter as shown in FIG. 17, the unbalance/balance conversion function can be achieved. However, such a surface acoustic wave filter has a problem in that, depending on selection of polarities of electrode fingers adjacent to each other between adjoining IDTs (depending on the combination of polarities of the respective electrode fingers), fine ripples occur within the pass band in terms of filter characteristics (frequency characteristics) to cause degradation in the insertion loss. FIG. 19 is a drawing that exemplifies the frequency characteristic near the pass band of such a conventional surface acoustic wave filter. In FIG. 19, such a fine ripple is indicated by an arrow portion.

Moreover, conventionally, with respect to the means for realizing a surface acoustic wave filter with a higher attenuation outside the pass band, a method has been widely used in which a plurality of stages of longitudinal coupling surface acoustic wave elements, each having three IDTs placed closely with one another along the propagation direction of a surface acoustic wave with reflectors being placed on the two sides thereof are longitudinally connected to construct a surface acoustic wave filter. Although the use of this structure makes it possible to increase the attenuation outside the pass band, the insertion loss within the pass band tends to deteriorate. For this reason, in an attempt to obtain a surface acoustic wave filter with a wider pass band width by using this structure, the required insertion loss is not sufficiently achieved.

In the case when a narrow pitch portion is formed at an end portion of an IDT as shown in a surface acoustic wave device disclosed in JP-A No. 2002-9587, since a portion having different electrode finger pitches is present in a state with a coupled surface acoustic wave, the ripple in the filter characteristic of the pass band becomes bigger, resulting in degradation in the shoulder characteristic. For this reason, it is not possible to obtain the flatness in the filter characteristic in the pass band. Moreover, only forming the narrow pitch portion at the end portion of the IDT causes a limitation of the number of basic resonance modes to be utilized for exciting the surface acoustic wave to a longitudinal primary mode and a longitudinal tertiary mode, with the result that the degree of freedom in designing becomes smaller because no other resonance modes can be utilized. Consequently, this method is insufficient in improving the flatness in filter characteristics in the pass band as well as in improving the insertion loss, with a wider pass band being provided.

In contrast, in a surface acoustic wave filter having a balance/unbalance conversion function, there have been demands for improvements in the degree of balance of the amplitude and of the phase within a pass band. For example, in a resonator-type electrode pattern in which reflectors are placed on the two ends of a surface acoustic wave transmitting path of a plurality of IDTs that are aligned side by side, so as to effectively resonate the surface acoustic wave, there have been demands for improving the degree of balance of the amplitude and of phase within the pass band.

JP-A No. 2002-9587 has disclosed a surface acoustic wave device which has a two-stage structure in which balanced input (output) terminals are connected to an IDT in the center on the second stage; however, since a structure having a modified structure of pitches of the IDTs located on the two sides of the IDT in the center or the like and a structure having a modified distance between the IDT located in the center and IDTs located on the two sides thereof are adopted so as to reverse the phase, the resulting problem is degradation in the degree of balance.

Moreover, in the case of a conventional resonator-type surface acoustic wave device 2000 disclosed in JP-A No. 11-97966, shown in FIG. 18, the structures, such as the numbers of opposing comb-shaped electrodes, the layout positions thereof, the polarities of electrode fingers mutually adjacent to each other between adjoining IDTs and the peripheral electrode patterns that cause to generate a parasitic capacity, are different from each other between IDTs 2003 and 2006. Consequently, since the amplitudes of signals to be transmitted to balanced output signal terminals 2022 and 2023 are different from each other, and since the phase is offset from the opposite phase, the resonator-type surface acoustic wave device 2000 fails to provide a sufficient degree of balance.

Moreover, in the surface acoustic wave filter disclosed in JP-A No. 2002-84164, since the polarity of the outermost side electrode finger of the IDT in the center and the polarity of the outermost side electrode finger of an adjacent IDT are different from each other on the right and left sides, the parasitic capacities formed on the respective balanced signal terminals are different from each other, with the result that the degree of balance is not necessarily improved sufficiently.

DISCLOSURE OF THE INVENTION

The present invention has been proposed so as to solve the above-mentioned conventional problems, and its objective is to provide a surface acoustic wave device of a balanced type having an unbalance/balance conversion function which improves the insertion loss by suppressing occurrence of fine ripples of the filter characteristic in a pass band, achieves the improvement of the degree of amplitude balance, and is capable of functioning as a high-quality balance-type surface acoustic wave filter, as well as a communication apparatus using such a surface acoustic wave device.

In order to solve the above-mentioned problems, a surface acoustic wave device in accordance with a first aspect, which has an unbalance/balance conversion function, includes: a surface acoustic wave resonator to which an unbalanced input/output terminal is connected and first and second surface acoustic wave elements parallel-connected to each other through the surface acoustic wave resonator, which are formed on a piezoelectric substrate, the first and second surface acoustic wave elements, each having three or more odd-numbered IDTs placed along a propagation direction of a surface acoustic wave propagated over the piezoelectric substrate, and provided with a plurality of electrode fingers the longitudinal direction of which is made orthogonal to the propagation direction; and first reflectors, placed on the two ends of an IDT row composed of the odd-numbered IDTs, each having a plurality of electrode fingers the longitudinal direction of which is made orthogonal to the propagation direction, with each of the first and second surface acoustic wave elements being provided with a balanced input/output terminal connected to the IDT in the center among the odd-numbered IDTs, and in this structure, among electrode fingers possessed by the odd-numbered IDTs and the first reflector, the electrode fingers to which different one of the IDTs or the first reflectors is adjacent have polarities that are arranged symmetrically centered on the IDT in the center of the first or the second surface acoustic wave element.

According to the first aspect, the distributions of excited surface acoustic waves in the high-order mode are made symmetrical with each other, the excited fields of the surface acoustic waves are also made symmetrical with each other, the reflection coefficients of the exciting electrode and the reflector electrode are not made smaller so that the reflection characteristic is improved, and the exciting efficiency becomes free from degradation; thus it becomes possible to restrain occurrence of local fine ripples.

Moreover, since the structure in which the first and second surface acoustic wave elements, which form a balanced input unit or a balanced output unit, are parallel-connected to each other through a surface acoustic wave resonator to which an unbalanced input/output terminal is connected is prepared, it is possible to easily provide an impedance matching.

The surface acoustic wave device in accordance with a second aspect, which relates to the surface acoustic wave device of the first aspect, is designed so that a second reflector composed of a plurality of electrode fingers the longitudinal direction of which is made orthogonal to the propagation direction are further placed between adjacent IDTs in the propagation direction among the odd-numbered IDTs.

According to the second aspect, by interpolating electrode fingers between the electrode fingers connected to a signal terminal, the distance of the transmitting path of a surface acoustic wave can be adjusted, and the difference in the amplitudes of surface acoustic waves between the first surface acoustic wave element and the second surface acoustic wave element is consequently made smaller so that it becomes possible to obtain a superior characteristic in the degree of amplitude balance.

The surface acoustic wave device in accordance with a third aspect, which relates to the surface acoustic wave device of the second aspect, is designed so that the second reflector is grounded.

According to the third aspect, since the amplitude of a surface acoustic wave is more effectively attenuated in comparison with the second aspect, the difference in the amplitudes of the surface acoustic waves between the first surface acoustic wave element and the second surface acoustic wave element is made further smaller so that it becomes possible to obtain a further superior characteristic in the degree of amplitude balance.

The surface acoustic wave device in accordance with a fourth aspect, which relates to the surface acoustic wave device of the second aspect, is designed so that each of the first and second surface acoustic wave elements has a first portion in which the electrode finger pitches vary along the propagation direction and a second portion in which the electrode finger pitches are constant, with the first and second portions being arranged so that the average value of electrode finger pitches in the first portion is made shorter than that of the electrode finger pitches in the second portion, with the electrode finger pitch of the first portion being made shorter toward the border of the adjoining two IDTs, and the electrode finger pitch of the second reflector is made shorter than the electrode finger pitch of the second portion.

According to the fourth aspect, the area of the piezoelectric substrate 1 occupied by the electrode fingers of the IDTs at portions having adjacent IDTs is adjusted so that the radiation loss of the surface acoustic wave to the bulk wave can be consequently prevented. In addition, since frequencies among the longitudinal primary mode, longitudinal tertiary mode and a high frequency mode between these modes are also adjusted, it becomes possible to suppress occurrence of fine ripples within the pass band, and consequently to achieve a desirable characteristic in the degree of amplitude balance. That is, a surface acoustic wave device, which has superior electrical characteristics, such as a wide pass band and a low insertion loss, can be achieved.

The surface acoustic wave device according to a fifth aspect, which relates to the surface acoustic wave device of the fourth aspect, has a structure in which in the first and second surface acoustic wave elements, the electrode finger pitches in IDTs other than the IDT in the center among the odd-numbered IDTs have a maximum value so that a portion having a greater electrode finger pitch than the electrode finger pitch of the second portion is placed in the first portion.

According to the fifth aspect, since the electrode fingers are arranged so that the resonance peak position in the pass band is optimized, it becomes possible to achieve filter characteristics with a wider band and improvements in flatness and insertion loss.

The surface acoustic wave device according to a sixth aspect, which relates to the surface acoustic wave device of the first aspect, has a structure in which one of the first reflectors in the first surface acoustic wave element and one of first reflectors in the second surface acoustic wave element are composed of a single reflector.

According to the sixth aspect, since the phases of surface acoustic waves respectively excited by the first surface acoustic wave element and the second surface acoustic wave element are mutually cancelled on the plus side and the minus side in the reflector formed in an integral manner, it becomes possible to provide a superior reflection characteristic. Thus, the occurrence of fine ripples within the pass band is further restrained.

The surface acoustic wave device in accordance with a seventh aspect, which relates to the surface acoustic wave device of the first aspect, has a structure in which in the first and second surface acoustic wave elements, the numbers of electrode fingers in the IDT in the center, connected to the balanced input/output terminal, are mutually the same.

According to the seventh aspect, the impedances of the IDTs in the center of the first and second surface acoustic wave element are not made different from each other, and it is possible to prevent occurrence of a phase delay due to the fact that the IDT in the center of one of the surface acoustic wave elements (for example, the first surface acoustic wave element) has a larger capacity than that of the IDT in the center of the other surface acoustic wave element (for example, the second surface acoustic wave element) and the subsequent biased phase balance characteristic toward the plus side or the minus side, thereby making it possible to provide a superior phase balance characteristic.

The surface acoustic wave device according to an eighth aspect, which relates to the surface acoustic wave device of the first aspect, has a structure in which in the first and second surface acoustic wave elements, the number of electrode fingers in the IDT in the center is set to an odd number.

According to the eighth aspect, with respect to the first surface acoustic wave element and second surface acoustic wave element, the polarities of electrode fingers, with a different IDT or reflector being positioned adjacent thereto, are made symmetrical with each other centered on the IDT located in the center; therefore, in the surface acoustic wave device, the distributions of excited surface acoustic waves in the high-order mode are made symmetrical with each other, the excited fields of the surface acoustic waves are made symmetrical with each other, and the reflection coefficients of the exciting electrode and the reflector electrode are not made smaller so that the reflection characteristic is improved, and the exciting efficiency becomes free from degradation; thus, it becomes possible to restrain the occurrence of local fine ripples.

A communication apparatus in accordance with a ninth aspect is provided with the surface acoustic wave device relating to the first aspect in at least one of a receiving circuit and a transmitting circuit.

According to the ninth aspect, it becomes possible to achieve a communication apparatus that satisfies conventional strict requirements for insertion loss, reduces power consumption, and is further superior in sensitivity.

The communication apparatus according to a tenth aspect, which relates to the communication apparatus of the ninth aspect, is provided with: a transmitting circuit provided with a mixer that superposes a transmitting signal on a carrier signal to form an antenna transmitting signal; a band pass filter that attenuates unnecessary signals of the antenna transmitting signal; and a power amplifier that amplifies the antenna transmitting signal and outputs the amplified antenna transmitting signal to an antenna through a duplexer, and the band pass filter is composed of the surface acoustic wave device.

The communication apparatus according to an eleventh aspect, which relates to the communication apparatus of the ninth aspect, is provided with: a receiving circuit provided with a low-noise amplifier that amplifies an antenna received signal that has been received by an antenna and allowed to pass through a duplexer; a band pass filter that attenuates unnecessary signals of the amplified antenna received signal; and a mixer that separates a received signal from a carrier signal of the antenna received signal, and the band pass filter is composed of the surface acoustic wave device.

BRIEF DESCRIPTION OF THE DRAWINGS

FIG. 5 is a plan view that schematically shows an electrode structure of a surface acoustic wave device 500 in accordance with a Fifth Embodiment, (a) is a drawing that shows a distribution of electrode finger pitches of IDTs of the surface acoustic wave device 500 of (b), and (b) is a plan view that schematically shows an electrode structure of the surface acoustic wave device 500.

FIG. 6 is a drawing that explains an electrode structure of a surface acoustic wave device 600 in accordance with a Sixth Embodiment, (a) is a drawing that shows a distribution of electrode finger pitches of IDTs of the surface acoustic wave device 600 of (b), (b) is a plan view that schematically shows an electrode structure of the surface acoustic wave device 600, and (c) is an enlarged plan view that shows an essential portion of the surface acoustic wave device 600.

FIG. 9 is a drawing that shows frequency characteristics near pass bands of surface acoustic wave devices relating to Example 1 and Comparative Example 1-1, (a) is a drawing relating to Example 1, and (b) is a drawing relating to Comparative Example 1-1.

FIG. 10 is a drawing that shows the degrees of phase balance near pass bands of surface acoustic wave devices relating to Example 1 and Comparative Example 1-2, (a) is a drawing relating to Example 1, and (b) is a drawing relating to Comparative Example 1-2.

FIG. 11 is a drawing that shows a frequency characteristic near a pass band of a surface acoustic wave device relating to Example 3.

FIG. 12 is a drawing that shows the degrees of balance near a pass band of a surface acoustic wave device relating to Example 3, (a) is a drawing that shows the degree of amplitude balance of Example 3, and (b) is a drawing that shows the degree of phase balance of Example 3.

BEST EMBODIMENT FOR CARRYING OUT THE INVENTION

Figure 1:
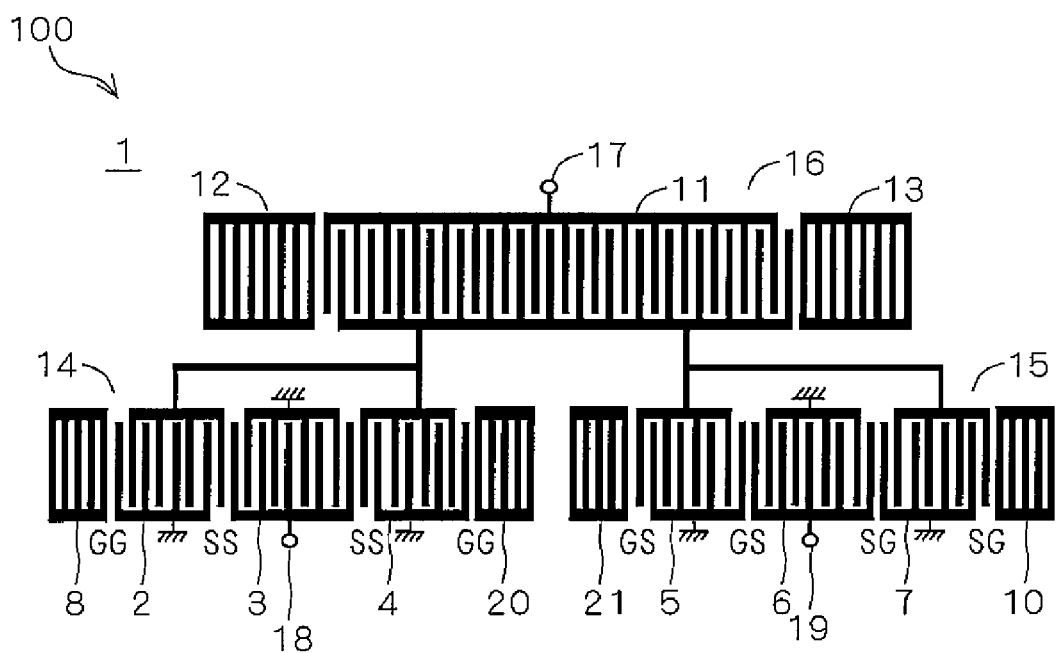
FIG. 1 is a plan view that schematically shows an electrode structure of a surface acoustic wave device 100 in accordance with a First Embodiment.

Referring to Figures, the following description will discuss embodiments of a surface acoustic wave device of the present invention in detail. In each of the embodiments, an explanation will be given by exemplifying a resonator type surface acoustic wave filter having a simple structure. Here, in the Figures to be explained below, the same components are indicated by the same reference numerals. Moreover, with respect to the sizes of the respective electrodes, the distance or the like between electrodes, the number of electrode fingers and the distance or the like between them are schematically shown in the Figures, for convenience of explanation. Furthermore, since the numbers of IDTs, reflectors, and the electrode fingers of a surface acoustic wave resonator 16 of the respective embodiments range from several to several hundreds, the shapes of them are simplified and shown in the respective Figures for simplicity of explanation.

First Embodiment

FIG. 1 is a plan view that schematically shows an electrode structure of a surface acoustic wave device 100 according to the First Embodiment of the present invention. As shown in FIG. 1, in the surface acoustic wave device 100, a first surface acoustic wave element 14 and a second surface acoustic wave element 15 are formed on a piezoelectric substrate 1. The first surface acoustic wave element 14 is configured by three IDTs 2, 3 and 4 placed along a propagation direction of a surface acoustic wave that is propagated over the surface of the piezoelectric substrate 1, and reflectors 8 and 20 respectively placed on the two ends of an IDT row composed of these three IDTs 2, 3 and 4. The second surface acoustic wave element 15 is configured by three IDTs 5, 6 and 7 placed along the propagation direction, and reflectors 21 and 10 respectively placed on the two ends of an IDT row composed of these three IDTs 5, 6 and 7. More specifically, as shown in FIG. 1, from the left side of the Figure, the reflector 8, the IDTs 2, 3 and 4, the reflectors 20 and 21, the IDTs 5, 6 and 7 and the reflector 10 are aligned in this order into one row along the propagation direction. Here, each of the IDTs 2 to 7 and the reflectors 8, 10, 20 and 21 is a comb-shaped electrode having a plurality of electrode fingers that are elongated in a direction orthogonal to the propagation direction (the longitudinal direction thereof is orthogonal to the propagation direction). Here, the first surface acoustic wave element 14 and the second surface acoustic wave element 15 respectively have three IDTs; however, this is only an exemplified structure, and any number thereof may be used as long as it is an odd number of three or more. Moreover, each of the reflectors 8, 10, 20 and 21 is grounded, and for convenience of explanation, these are omitted from the Figures including those explained below.

The first surface acoustic wave element 14 and the second surface acoustic wave element 15 are parallel-connected to each other, with a surface acoustic wave resonator 16 that serves as a surface acoustic wave element configured by a single IDT 11 and the reflectors 12 and 13 on the two ends being interposed therebetween. An unbalanced input/output terminal 17, which forms an unbalanced input terminal or an unbalanced output terminal, is connected to the surface acoustic wave resonator 16.

Moreover, the first surface acoustic wave element 14 and the second surface acoustic wave element 15 are respectively used as an unbalanced output unit or an unbalanced input unit. Balanced input/output terminals 18 and 19, which form balanced output terminals or balanced input terminals, are respectively connected to the respective centered IDTs 3 and 6 of the first surface acoustic wave element 14 and the second surface acoustic wave element 15.

Moreover, each of the first surface acoustic wave element 14 and the second surface acoustic wave element 15 is designed so that the adjacent electrode fingers between the adjoining IDTs as well as the adjacent electrode fingers between the adjoining IDT and reflector have polarities that are made symmetrical with each other centered on the IDT electrode 3 or 6 located in the center. In other words, each of the first surface acoustic wave element 14 and the second surface acoustic wave element 15 is designed so that the polarities of the electrode fingers with a different IDT or reflector being positioned adjacent thereto are made symmetrical with each other centered on the IDT 3 or 6 located in the center.

In order to explain this structure, in the explanation below, as shown in FIG. 1, those electrode fingers that correspond to the above-mentioned adjacent portions, and are connected to the unbalanced input/output terminal 17 side (to the surface acoustic wave resonator 16 to which is connected the unbalanced input/output terminal 17), and those electrode fingers that are connected to the balanced input/output terminals 18 and 19 are indicated by symbol S, while those grounded electrode fingers (those electrode fingers connected to the electrode fingers and the connecting terminals of the reflector) are indicated by symbol G. Then, in the first surface acoustic wave element 14, the polarities of all the electrode fingers that belong to mutually different IDTs and reflectors and have such a relationship that they are mutually adjacent to each other, are indicated by G, G, S, S, S, S, G, G from the left side of the Figure. That is, the polarities of the electrode fingers are made symmetrical with each other centered on the IDT 3 located in the center. In the same manner, in the second surface acoustic wave element 15, the polarities thereof are indicated by G, S, G, S, S, G, S, G from the left side of the Figure. Thus, the polarities thereof are made symmetrical with each other centered on the IDT 6. Therefore, the first surface acoustic wave element 14 and the surface acoustic wave element 15 are confirmed to have the above-mentioned structures.

With the above-mentioned structures, since the polarity layouts of the electrode fingers in the adjacent IDTs are made symmetrical with each other, the distributions in the high-order mode of excited surface acoustic waves are made symmetrical with each other so that the excited fields of the surface acoustic waves are made symmetrical with each other. Moreover, the reflection coefficients of the exciting electrode and the reflector electrode are not made smaller so that the reflection characteristic is improved; thus, the exciting efficiency becomes free from degradation. Consequently, no problems arise in that fine ripples occur locally in the filter characteristic. That is, the improvement of insertion loss within the pass band, which is strictly demanded in the filter characteristic of the surface acoustic wave filter, can be achieved.

In other words, as shown in FIG. 1, each of the first surface acoustic wave element 14 and the second surface acoustic wave element 15 is designed so that the number of the electrode fingers of each of the IDTs 3 and 6 in the center is set to an odd number. In the case when designed so as to satisfy this requirement, each of the first surface acoustic wave element 14 and the second surface acoustic wave element 15 is formed so that the polarities of the electrode fingers with a different IDT or reflector being positioned adjacent thereto are made symmetrical with each other centered on the IDT 3 or 6 located in the center.

Moreover, the surface acoustic wave device 100 in accordance with the present Embodiment has a structure in which the first surface acoustic wave element 14 and the second surface acoustic wave element 15, which form a balanced input unit or a balanced output unit, are parallel-connected through the surface acoustic wave resonator 16 to which the unbalanced input/output terminal 17 is connected. In the case when the connection end of the unbalanced input/output terminal 17 is a longitudinal coupling resonator-type surface acoustic wave element, if an input or an output of 50Ω is given to or released from the unbalanced input/output terminal 17, it becomes difficult to provide a required impedance matching; however, when the surface acoustic wave resonator 16, which is a surface acoustic wave element the first stage of which is composed of single IDT and reflector, is used as in the case of the present Embodiment, it becomes possible to easily provide an impedance matching.

Moreover, as shown in FIG. 1, in the above-mentioned structure, the first surface acoustic wave element 14 and the second surface acoustic wave element 15 are preferably designed so that the numbers of the electrode fingers that are connected to the balanced input/output terminals 18 and 19 in the IDTs 3 and 6 in the center are made equal to each other.

With this arrangement, the impedances of the IDTs 3 and 6 in the center are not made different from each other, and it is possible to prevent occurrence of a phase delay due to the fact that the IDT (for example, IDT 3) in the center of one of the surface acoustic wave elements (for example, the first surface acoustic wave element 14) has a larger capacity than that of the IDT (IDT 6) in the center of the other surface acoustic wave element (for example, the second surface acoustic wave element 15) and the subsequent biased phase balance characteristic toward the plus side or the minus side, thereby making it possible to provide a superior phase balance characteristic.

Second Embodiment

Figure 2:
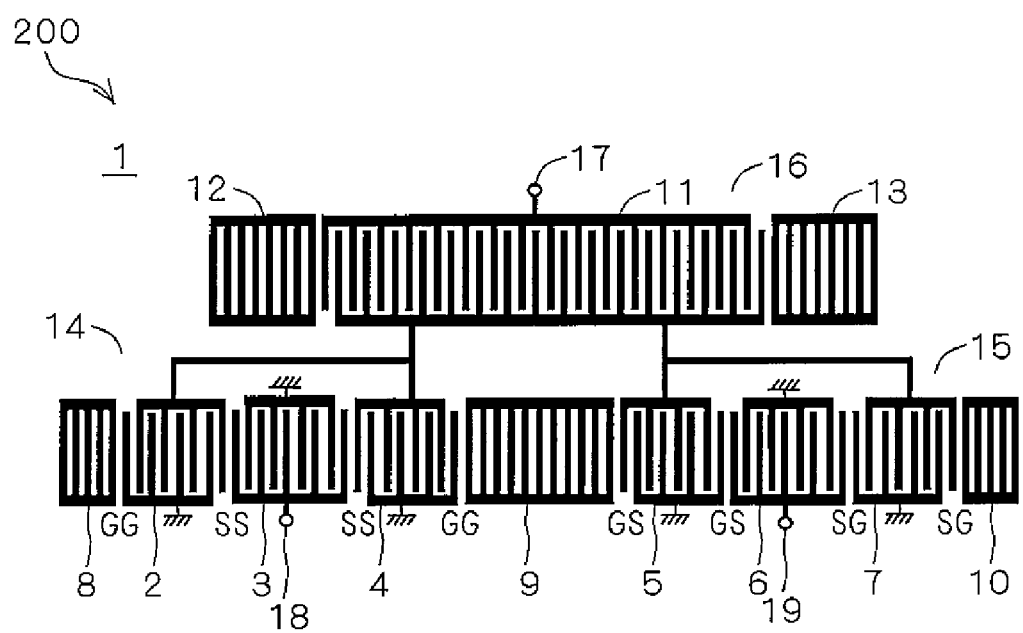
FIG. 2 is a plan view that schematically shows an electrode structure of a surface acoustic wave device 200 in accordance with a Second Embodiment.

FIG. 2 is a plan view that schematically shows an electrode structure of a surface acoustic wave device 200 according to the Second Embodiment of the present invention. As shown in FIG. 2, the surface acoustic wave device 200 is different from the surface acoustic wave device 100 relating to the First Embodiment in that in place of the reflector 20 and the reflector 21, a reflector 9 is installed. In other words, the reflector 9 has a structure in which the reflector 20 and the reflector 21 are integrally formed. Here, although the reflector 9 is grounded, it is omitted from the Figures including Figures shown below for convenience of explanation.

In the surface acoustic wave device 200 having the above-mentioned structure, since the phases of surface acoustic waves respectively excited by the first surface acoustic wave element 14 and the second surface acoustic wave element 15 are mutually cancelled on the plus side and the minus side in the reflector 9 formed in an integral manner, it becomes possible to provide a superior reflection characteristic. Thus, the occurrence of fine ripples within the pass band is further restrained. As a result, it becomes possible to provide a surface acoustic wave device that further reduces the insertion loss within the pass band.

Third Embodiment

Figure 3:
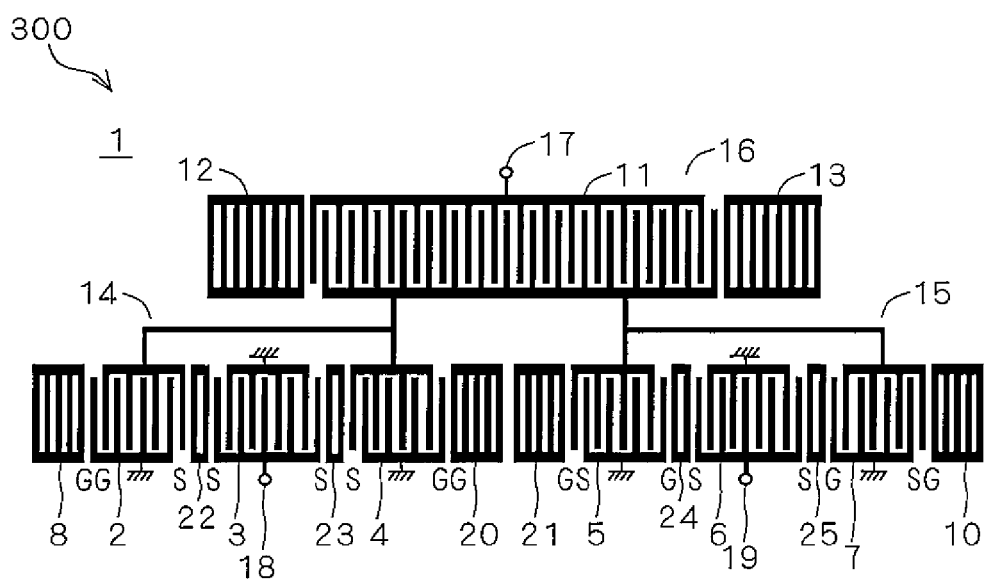
FIG. 3 is a plan view that schematically shows an electrode structure of a surface acoustic wave device 300 in accordance with a Third Embodiment.

FIG. 3 is a plan view that schematically shows an electrode structure of a surface acoustic wave device 300 according to the Third Embodiment of the present invention. As shown in FIG. 3, the surface acoustic wave device 300 has an electrode structure in which, between the IDTs that are adjacent in the propagation direction of the surface acoustic wave device 100 relating to the First Embodiment, reflectors 22, 23, 24 and 25 are further placed. More specifically, between the IDT 2 and IDT 3, between the IDT 3 and IDT 4, between the IDT 5 and IDT 6, as well as between the IDT 6 and IDT 7, reflectors 22 to 25, each having long electrode fingers in a direction orthogonal to the propagation direction, are placed respectively. Here, for convenience of distinction, the reflectors 8, 9, 10, 20 and 21 are referred to as first reflectors, and the reflectors 22, 23, 24 and 25 are referred to as second reflectors.

That is, by installing the second reflectors 22, 23, 24 and 25 therein, the surface acoustic wave device 300 has a structure in which, between electrode fingers connected to the signal terminals of the respective IDTs, an electrode finger is further interposed.

Figure 16:
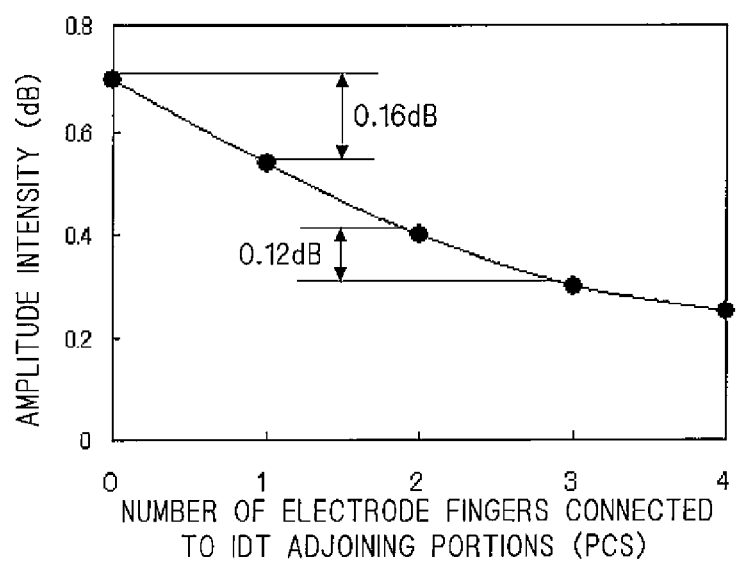
FIG. 16 is a drawing that shows the relationship between the number of electrode fingers located between electrode fingers connected to signal terminals at a place having adjacent IDTs, or the number of electrode fingers of an IDT or a second reflector, and the amplitude intensity.
Figure 17:
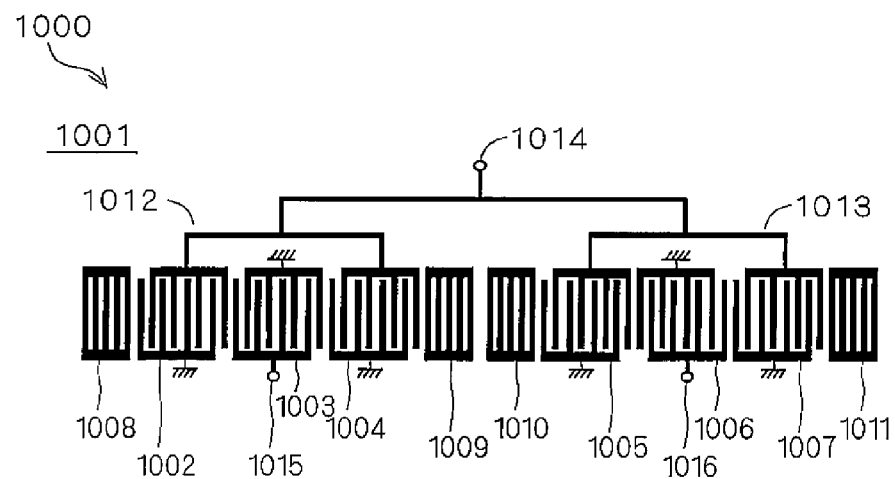
FIG. 17 is a plan view that schematically shows an electrode structure of a conventional surface acoustic wave device 1000.
Figure 18:
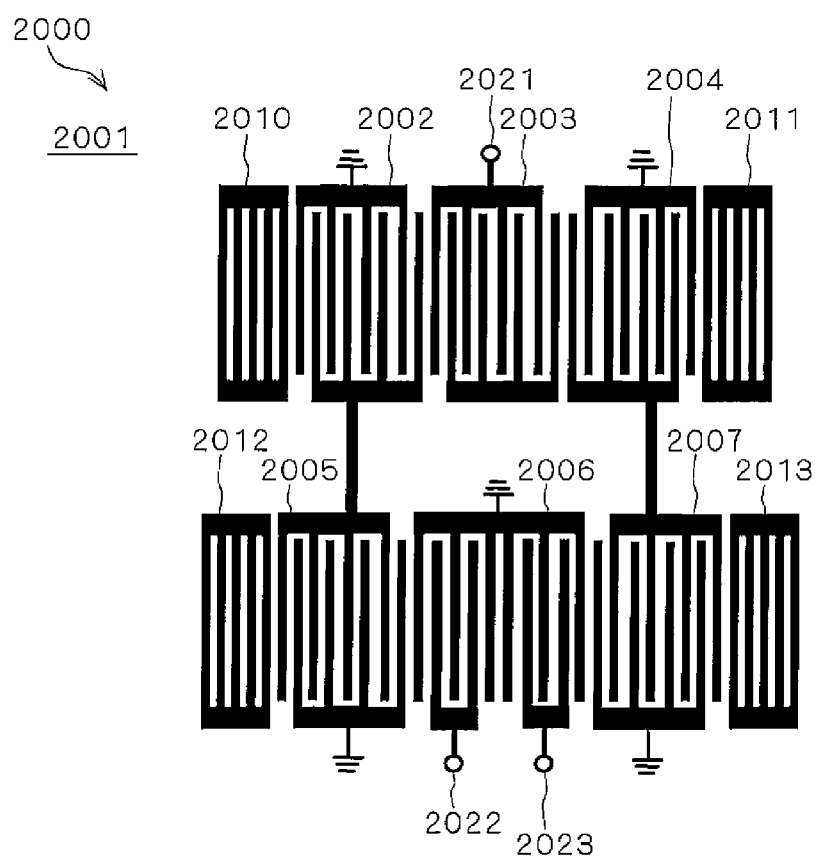
FIG. 18 is a plan view that schematically shows an electrode structure of another conventional surface acoustic wave device 2000.
Figure 19:
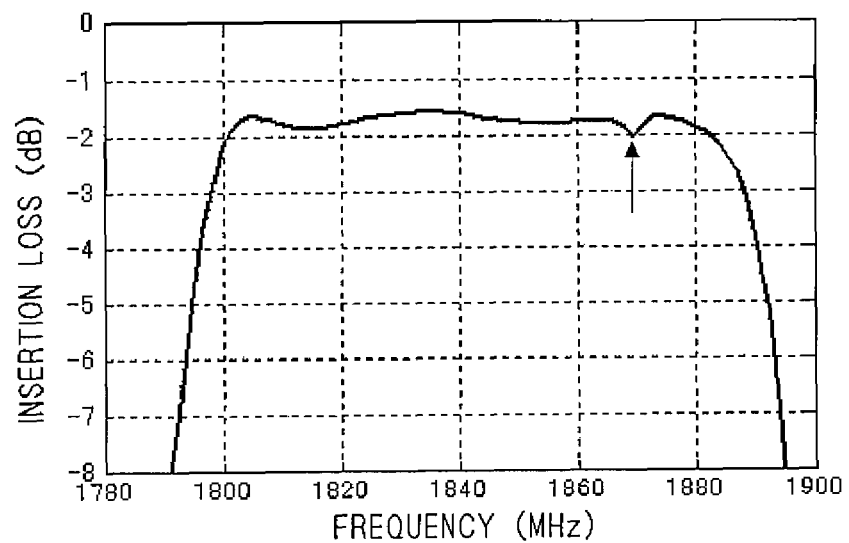
FIG. 19 is a drawing that exemplifies a frequency characteristic near a pass band of a conventional surface acoustic wave filter.

FIG. 16 is a drawing that shows the relationship between the number of electrode fingers located between electrode fingers connected to signal terminals at a place having adjacent IDTs, or the number of electrode fingers of an IDT or a second reflector, and the amplitude intensity. In the case of the surface acoustic wave device 100 relating to the First Embodiment where no second reflectors are placed, the number of electrode fingers located between the electrode fingers connected to the signal terminals is 0 in the first surface acoustic wave element 14, and the number thereof is 1 in the second surface acoustic wave element 15. As shown in FIG. 16, in this case, the degree of amplitude balance was 0.16 dB. In contrast, in the case of the surface acoustic wave device 300 provided with the second reflectors, relating to the present embodiment, the number of electrode fingers located between the electrode fingers connected to the signal terminals is 2 in the first surface acoustic wave element 14, and the number thereof is 3 in the second surface acoustic wave element. As shown in FIG. 16, in this case, the degree of amplitude balance was 0.12 dB.

This fact means that by interpolating electrode fingers between the electrode fingers connected to the signal terminals at a place having adjacent IDTs, the distance of the transmitting path of the surface acoustic wave is adjusted so that the amplitude intensities of the surface acoustic waves of the first surface acoustic wave element and the second surface acoustic wave element can be adjusted and equalized (made the difference smaller).

That is, by placing the second reflector with its electrode fingers being interpolated, the distance of the transmitting path of the surface acoustic wave is finely adjusted preliminarily so that it becomes possible to achieve surface acoustic wave device of which the amplitude intensities of the surface acoustic waves of the first surface acoustic wave element 14 and the second surface acoustic wave element 15 are finely adjusted. In the surface acoustic wave device 300 of the present embodiment which has been adjusted as described above, it is possible to suppress occurrence of fine ripples within the pass band, and also to achieve a superior characteristic in the degree of amplitude balance.

The number of electrode fingers in each of the second reflectors 22, 23, 24 and 25 in the surface acoustic wave device 300 is preferably set to 2 to 4. In the case when the number of the electrode fingers is greater than this range, since the transmission loss increases in the surface acoustic wave, it is not possible to obtain a desirable insertion loss.

Fourth Embodiment

Figure 4:
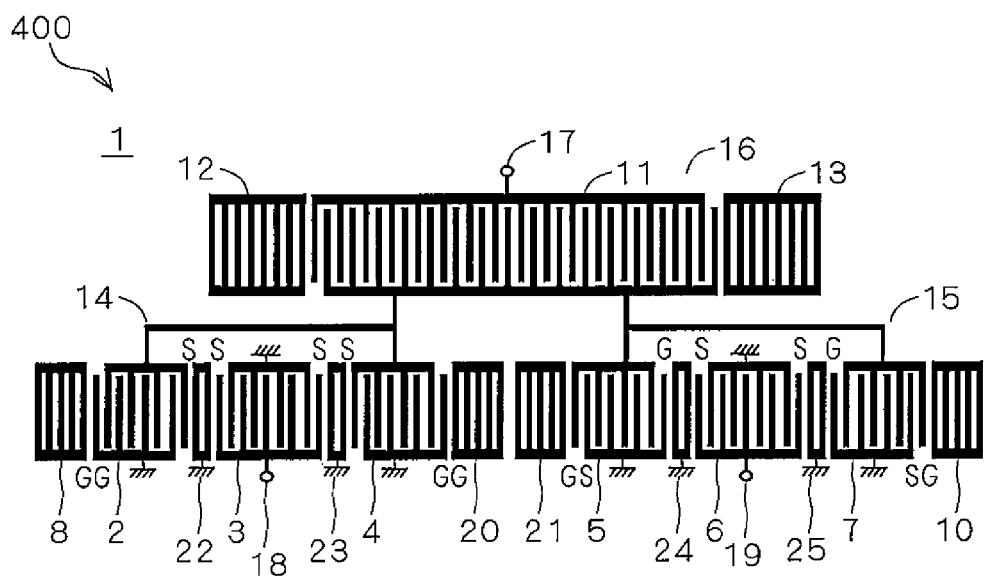
FIG. 4 is a plan view that schematically shows an electrode structure of a surface acoustic wave device 400 in accordance with a Fourth Embodiment.

FIG. 4 is a plan view that schematically shows an electrode structure of a surface acoustic wave device 400 in accordance with the Fourth Embodiment of the present invention. As shown in FIG. 4, the surface acoustic wave device 400 has a structure in which the second reflectors 22, 23, 24 and 25 relating to the surface acoustic wave device 300 of the Third Embodiment are grounded. With this structure, the surface acoustic wave device 400 makes it possible to attenuate the amplitude of the surface acoustic wave more effectively than the surface acoustic wave device 300 relating to the Third Embodiment.

That is, by placing a grounded second reflector between the electrode fingers connected to the signal terminals of the respective IDTs, with its electrode fingers interpolated therebetween, the amplitude intensities of the surface acoustic waves of the first surface acoustic wave element 14 and the second surface acoustic wave element 15 can be adjusted more desirably. In the surface acoustic wave device 400 of the present embodiment adjusted in this manner, the difference in the amplitudes of the surface acoustic waves between the first surface acoustic wave element 14 and the second surface acoustic wave element 15 is made smaller in comparison with that of the surface acoustic wave device 300 relating to the Third Embodiment so that it becomes possible to achieve a further superior characteristic in the degree of amplitude balance.

Fifth Embodiment

FIG. 5 is a drawing that explains an electrode structure of a surface acoustic wave device 500 according to the Fifth Embodiment of the present invention. FIG. 5(a) is a line drawing that shows variations in electrode finger pitches in a first surface acoustic wave element 514 installed in the surface acoustic wave device 500. FIG. 5(b) is a plan view that schematically shows an electrode structure of the surface acoustic wave device 500.

As shown in FIG. 5(b), the surface acoustic wave device 500 has a structure similar to the surface acoustic wave element 400 according to the Fourth Embodiment. That is, in the same manner as in the first elastic wave surface element 14 of the surface acoustic wave device 400, the first surface acoustic wave element 514 of the surface acoustic wave device 500 is provided with three IDTs 502, 503 and 504, two first reflectors 8 and 20, and two second reflectors 22 and 23. Moreover, in the same manner as in the second elastic wave surface element 15 of the surface acoustic wave device 400, the second surface acoustic wave element 515 is provided with three IDTs 505, 506 and 507, two first reflectors 21 and 10, and two second reflectors 24 and 25. Furthermore, the polarities of the electrode fingers of the respective IDTs and reflectors are the same as those of the corresponding portions of the surface acoustic wave device 400.

However, the layout intervals of the electrode fingers in the first surface acoustic wave element 514 and the second surface acoustic wave element 515 are different from those of the corresponding portions of the surface acoustic wave device 400. More specifically, in the first surface acoustic wave element 514 and the second surface acoustic wave element 515, the intervals of the electrode fingers are set so as to provide a first portion (varied pitch portion) and a second portion (fixed pitch portion). More specifically, the surface acoustic wave device 400 has electrode fingers that are placed so as to satisfy the following requirements:

1) The average value of the electrode finger pitch in the first portion is shorter than the electrode finger pitch of the second portion;
2) The electrode finger pitch of the first portion is made shorter toward the border of the two adjacent IDTs (toward the second reflector); and
3) The electrode finger pitch of the second reflectors 22, 23, 24 and 25 is shorter than the electrode finger pitch of the second portion.

With this arrangement, the first portion is prepared as a narrow pitch portion, with an electrode finger pitch shorter than that of the second portion.

FIG. 5(a) exemplifies the relationship of these electrode finger pitches with respect to the first surface acoustic wave element 514. FIG. 5(a) is a drawing (the scale of which is desirably determined) that shows variations in the electrode finger pitch p(x) in the case when the propagation direction of the surface acoustic wave of the piezoelectric substrate 1 is set as the axis of abscissas (x-axis). In FIG. 5(a), it is supposed that in the x-axis direction, five divided sections having different electrode finger pitches are placed. The sections L2 and L4 correspond to the first portion, and the sections L1, L3 and L5 correspond to the second portion. The mode of variations in the electrode finger pitch in FIG. 5(a) clearly indicates that the above-mentioned three requirements are satisfied. Although not shown in the Figure, the second surface acoustic wave element 515 is also designed so as to satisfy the same relationship.

In the surface acoustic wave device 500 manufactured so as to satisfy the above-mentioned requirements, the area on the piezoelectric substrate 1, occupied by the electrode fingers of the IDTs at portions where the IDTs are adjacent with each other, can be adjusted so that it becomes possible to prevent radiation loss of the surface acoustic wave to the bulk wave. In addition, since frequencies among the longitudinal primary mode, longitudinal tertiary mode and a high frequency mode between these modes are also adjusted, it becomes possible to suppress occurrence of fine ripples within the pass band, and consequently to achieve a desirable characteristic in the degree of amplitude balance. That is, a surface acoustic wave device having superior electrical characteristics such as a wide pass band and a low insertion loss can be achieved.

Sixth Embodiment

FIG. 6 is a drawing that explains an electrode structure of a surface acoustic wave device 600 according to the Sixth Embodiment of the present invention. FIG. 6(a) is a line drawing that shows variations in electrode finger pitches in a first surface acoustic wave element 614 installed in the surface acoustic wave device 600. FIG. 6(b) is a plan view that schematically shows an electrode structure of the surface acoustic wave device 600. Here, for simplicity of illustration, the structure of the electrode fingers of the surface acoustic wave device 600 shown in FIG. 6(b) is different from the actual mode. Moreover, FIG. 6(c) is an enlarged drawing that shows the structure near portion A of FIG. 6(b) in detail.

The surface acoustic wave device 600 has a structure similar to that of the surface acoustic wave device 500 relating to the Fifth Embodiment. That is, the electrode fingers are placed in a manner so as to satisfy the same requirements as those shown in the Fifth Embodiment.

More specifically, the first surface acoustic wave element 614 of the surface acoustic wave device 600 is provided with three IDTs 602, 603 and 604, two first reflectors 8 and 20, and two second reflectors 22 and 23. Moreover, the second surface acoustic wave element 615 is provided with three IDTs 605, 606 and 607, two first reflectors 21 and 10, and two second reflectors 24 and 25. Furthermore, the polarities of the electrode fingers of the respective IDTs and reflectors are the same as those of the corresponding portions of the surface acoustic wave device 500. In the same manner as the surface acoustic wave device 500, the first surface acoustic wave element 614 and the second surface acoustic wave element 615 are designed so that the intervals of the electrode fingers are set so as to provide a first portion (variation pitch portion) and a second portion (fixed pitch portion).

Here, the electrode finger pitches of the first portion (variation pitch portion) in the respective first surface acoustic wave element 614 and second surface acoustic wave element 615 are different from those of the first surface acoustic wave element 514 and second surface acoustic wave element 515 of the surface acoustic wave device 500. In order to explain this structure, FIG. 6(*a*) exemplifies the relationship of these electrode finger pitches with respect to the first surface acoustic wave element 614 by using the same coordinate axes as those of FIG. 5(*a*) (the scale of which is desirably determined). In FIG. 6(*a*) also, in the same manner as in FIG. 5(*a*), it is supposed that in the x-axis direction, five divided sections having different electrode finger pitches are placed, and the sections L2 and L4 correspond to the first portion, and the sections L1, L3 and L5 correspond to the second portion. However, the mode of variations in the electrode finger pitch of the first portion (sections L2 and L4) is different from that of FIG. 5(*a*). That is, FIG. 6(*a*) is different from FIG. 5(*a*) in that each of the sections L2 and L4 of FIG. 6(*a*) has a portion having an electrode finger pitch that is greater than the electrode finger pitch of the second portion.

Here, the second surface acoustic wave element 615 is also designed so as to satisfy the same relationship. FIG. 6(*c*) is an enlarged drawing that shows the detailed structure near portion A of the second surface acoustic wave element 615 of FIG. 6(*b*). As shown in FIG. 6(*c*), in the second surface acoustic wave element 615, the IDT 607 is constituted by three portions, that is, a reduction portion 607*a*, a maximum portion 607*b* and a fixed portion 607*c* that have mutually different intervals in the electrode fingers. The reduction portion 607*a* is a portion in which the pitch of the electrode fingers near the second reflector 24 is relatively small (smaller than that of the second portion), and virtually corresponds to the reduction portion of each of the sections L2 and L4 in FIG. 6(*a*). The maximum portion 607*b* is a portion in which the pitch of the electrode fingers is relatively large (larger than that of the second portion), and virtually corresponds to the maximum portion of each of the sections L2 and L4 in FIG. 6(*a*). The fixed portion 607*c* is a portion that forms the second portion (fixed pitch portion). This virtually corresponds to each of the section L1, the section L3 and the section L5 in FIG. 6(*a*).

The above-mentioned mode is also prepared in the other IDTs having the same layout relationship as that of the IDT 607 in the surface acoustic wave device 600. That is, the surface acoustic wave device 600 relating to the present Embodiment is designed so that in the first surface acoustic wave element 614 and the second surface acoustic wave element 615, the electrode finger pitches of each of the IDTs 602, 604, 605 and 607 other than the IDTs 603 and 606 in the center are allowed to have a maximum portion.

The above-mentioned arrangement of the present Embodiment makes it possible to obtain the same effect as that of the Fifth Embodiment. Moreover, by arranging the electrode fingers so as to optimize the resonance peak position in the pass band, filter characteristics with a wider band and improvements in flatness and insertion loss can be consequently achieved.

Seventh Embodiment

Figure 7:
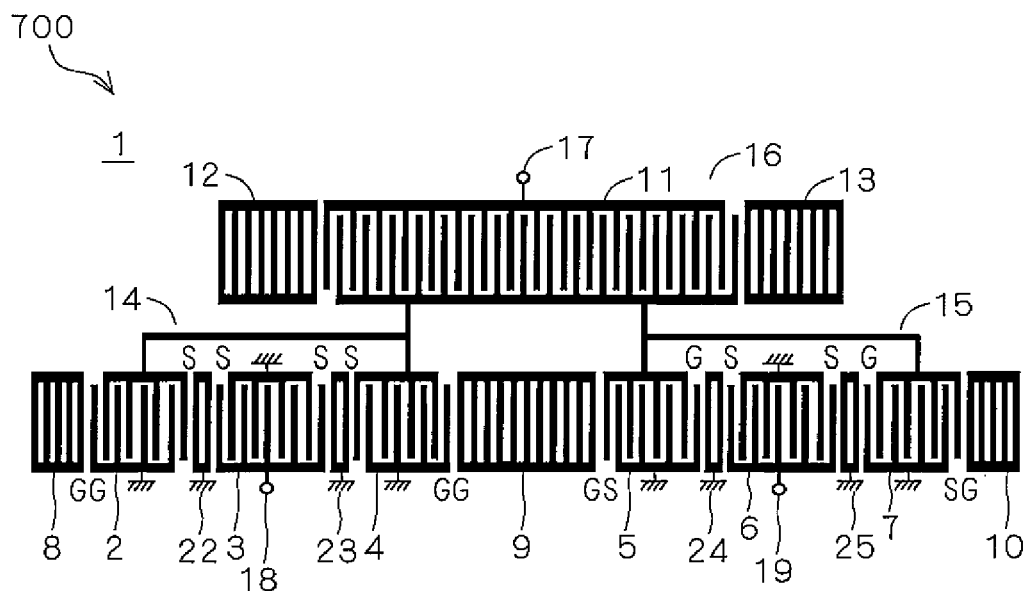
FIG. 7 is a plan view that schematically shows an electrode structure of a surface acoustic wave device 700 in accordance with a Seventh Embodiment.

FIG. 7 is a plan view that schematically shows an electrode structure of a surface acoustic wave device 700 according to the Seventh Embodiment of the present invention. As shown in FIG. 7, the surface acoustic wave device 700 has an electrode structure in which, between the adjacent IDTs in the propagation direction of the surface acoustic wave device 200 relating to the Second Embodiment, second reflectors 22, 23, 24 and 25 are further placed, and respectively grounded. Alternatively, the electrode structure is designed so that in place of the first reflectors 20 and 21 of the surface acoustic wave device 400 relating to the Fourth Embodiment, the reflector 9 is installed. The latter structure is also referred to as a structure having the reflector 9 in which the reflector 20 and the reflector 21 are integrally formed.

In the surface acoustic wave device 700 having the above-mentioned structure, in the same manner as in the surface acoustic wave device 200 relating to the Second Embodiment, the phases of surface acoustic waves respectively excited by the first surface acoustic wave element 14 and the second surface acoustic wave element 15 are mutually cancelled on the plus side and the minus side in the reflector 9 formed in an integral manner; therefore, it becomes possible to provide a superior reflection characteristic. Thus, the occurrence of fine ripples within the pass band is further restrained. As a result, it becomes possible to provide a surface acoustic wave device that further reduces the insertion loss within the pass band in comparison with the surface acoustic wave device 400 relating to the Fourth Embodiment.

<Production of Surface Acoustic Wave Device>

With respect to the piezoelectric substrate 1 to be used as the surface acoustic wave device of the above-mentioned respective Embodiments, 36°±3° Y-cut X-propagation lithium tantalate single crystal, 42°±3° Y-cut X-propagation lithium tantalate single crystal, 64°±3° Y-cut X-propagation lithium niobate single crystal, 41°±3° Y-cut X-propagation lithium niobate single crystal and 45°±3° X-cut Z-propagation lithium tetraborate single crystal are preferably used because these have a high electromechanical coupling coefficient and a low frequency temperature coefficient. Moreover, among these pyroelectric piezoelectric single crystals, a piezoelectric substrate 1 using any one of these that are extremely reduced in the pyroelectric property by oxygen deficiency and solid solution of Fe or the like is preferably used to provide superior device reliability. The thickness of the piezoelectric substrate 1 is preferably set in a range from 0.1 to 0.5 mm, and the thickness of less than 0.1 mm makes the piezoelectric substrate 1 fragile, while the thickness exceeding 0.5 mm causes a high material cost and a large dimension in parts and is not suitable for practical use. Moreover, the electrode structures of the IDTs, reflectors and the like are formed with Al or an Al alloy (Al—Cu based alloy or Al—Ti-based alloy). These are formed by using a thin-film forming method, such as a vapor deposition method, a sputtering method or a CVD method. By setting the electrode thickness to a range from 0.1 to 0.5 μm, it is possible to provide desirable characteristics as the surface acoustic wave device.

Furthermore, a protective film, made from $SiO_2$, $SiN_x$, Si or $Al_2O_3$, may be formed on the electrode structure portion and the propagation portions for surface acoustic waves on the piezoelectric substrate 1 of the surface acoustic wave device of the present invention so as to prevent conductive foreign matters from carrying a current and also to improve current proof.

In the surface acoustic wave device according to each of the above-mentioned Embodiments, the number of the IDTs and the other structures thereof may be modified on demand without departing the gist and scope of the present invention.

<Application to Communication Apparatus>

Here, the surface acoustic wave device according to each of the above-mentioned Embodiments may be applied to a communication apparatus. That is, in a communication apparatus provided with at least a receiving circuit or a transmitting circuit, it is used as a band pass filter included in such a circuit.

Figure 20:
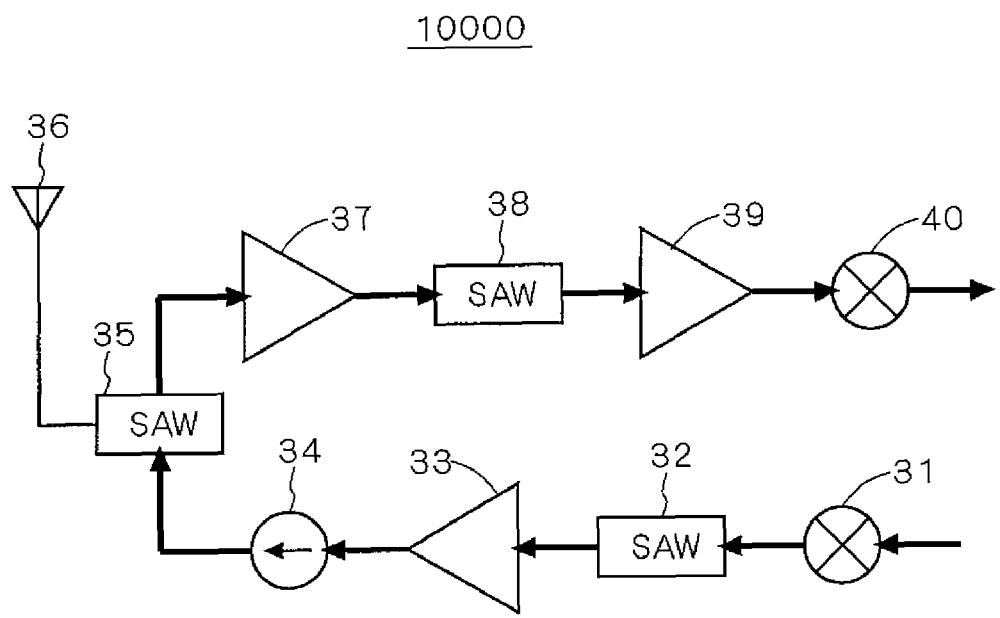
FIG. 20 is a block circuit diagram that shows a high frequency circuit having a band pass filter.

FIG. 20 is a block circuit diagram showing a high frequency circuit provided with a band pass filter. The high frequency circuit is one example of such a circuit to be assembled into a mobile telephone serving as a communication apparatus. In the high frequency circuit, a transmission signal (high frequency signal) is superimposed on a carrier signal by a mixer 31 to be formed into an antenna transmitting signal, and the antenna transmitting signal in which unnecessary signals have been attenuated by a band pass filter 32 is amplified by a power amplifier 33, and released from an antenna 36 through an isolator 34 and a surface acoustic wave branching filer (duplexer) 35. Moreover, an antenna received signal, received by the antenna 36, is passed through the surface acoustic wave branching filter 35, and amplified by a low-noise amplifier 37, and after its unnecessary signals have been attenuated by the band pass filter 38, the resulting signal is re-amplified by an amplifier 39, and converted to a low frequency signal by a mixer 40.

Upon constructing such a communication apparatus 10000, the surface acoustic wave device in accordance with each of the Embodiments of the present invention may be used as the transmitting band pass filter 32 and the receiving band pass filter 38. By using the surface acoustic wave device of the present invention, the insertion loss can be improved so that a communication apparatus that has reduced power consumption and is further superior in sensitivity can be achieved.

EXAMPLES

Example 1

In the present Example, the surface acoustic wave element 200 relating to the Second Embodiment was manufactured, and its characteristics were evaluated. More specifically, on a piezoelectric substrate 1 made from 38.7° Y-cut X-propagation direction $LiTaO_3$ single crystal (strictly speaking, in a state of a base substrate used for taking a number of pieces), fine electrode patterns were formed by using Al (99% by mass)—Cu (1% by mass). The formation of each of the electrode patterns was carried out by a photolithography process using a sputtering device, a reduction projection exposing machine (stepper) and a RIE (Reactive Ion Etching) device. Here, the target pass band was set in a range from 1930 MHz to 1990 MHz.

First, the piezoelectric substrate 1 was ultrasonic-wave-washed by using acetone, IPA (isopropyl alcohol) or the like so that the organic components were removed. Next, after having been sufficiently dried by using a clean oven, a metal layer to be formed into respective electrodes was film-formed on the resulting piezoelectric substrate 1. The film-forming process of the metal layer was carried out by using a sputtering device, with an Al (99% by mass)—Cu (1% by mass) alloy being used as a material for the metal layer. The thickness of the metal layer was set to about 0.18 μm.

Next, photoresist was spin-coated on the metal layer with a thickness of about 0.5 μm, and this was patterned by a reduction projection exposing machine (stepper) into a desired shape, and photoresist on the unnecessary portions was dissolved by an alkali developing solution in a developing device so that a desired pattern was allowed to appear. Thereafter, the metal layer was then subjected to an etching process by using an RIE device so that the patterning process was completed. Thus, the pattern of an electrode structure relating to the surface acoustic wave device was obtained.

Thereafter, a $SiO_2$ layer serving as a protective layer was formed with a thickness of about 0.02 μm on the respective electrode patterns and the piezoelectric substrate 1 by using a CVD (Chemical Vapor Deposition) device.

Successively, this was subjected to a patterning process through photolithography, and then subjected to an etching process of window opening portions for flip chips by using a RIE device or the like. Thereafter, a layer for pad electrodes, mainly composed of Al, was film-formed on those window opening portions for flip chips by using a sputtering device. At this time, the film thickness of the layer for pad electrodes was set to about 1.0 μm. Moreover, the photoresist and Al on the unnecessary portions were simultaneously removed by using a lift-off method so that pad electrodes were completed.

Next, a bump bonding device was used so that conductor bumps, which were to be used for flip-chip-forming a surface acoustic wave device 200 on an external circuit substrate or the like, were formed on the pad electrode by using Au. The diameter of the conductor bump was about 80 μm, with its height being set to about 30 μm.

Next, the piezoelectric substrate 1 was subjected to a dicing process along division lines to be divided into a number of chips. Each of the chips forms a surface acoustic wave device. Thereafter, the respective chips were housed in a package with the electrode pad forming face thereof facing down, and bonded thereto by using a flip-chip assembling device, and this was further subjected to a baking process in a $N_2$ atmosphere so that the surface acoustic wave device was packaged. With respect to the package, such a package having a laminated structure having 2.5×2.0 mm in cube, composed of multiple of laminated ceramic layers, was used.

The characteristics of the surface acoustic wave device 200 were evaluated by using a multi-port network analyzer ("E5071A" made by Agilent Technologies, Inc.) in which a signal of 0 dBm was inputted under conditions of a frequency in a range of 1640 to 2140 MHz and 801 measuring points. The number of samples was set to 30.

Comparative Example 1-1

Figure 8:
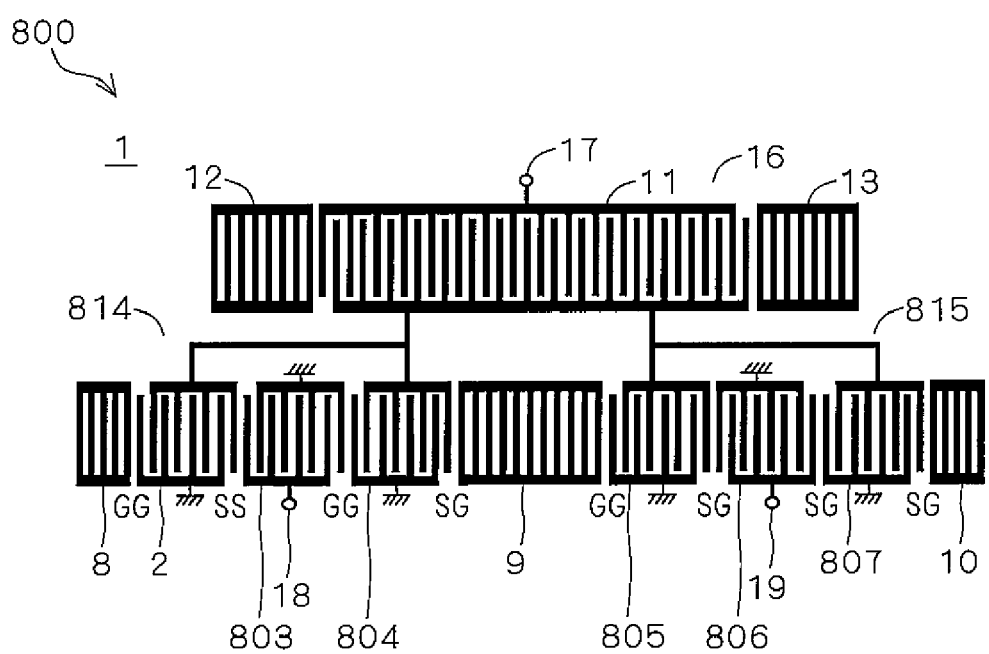
FIG. 8 is a plan view that schematically shows an electrode structure of a surface acoustic wave device 800 in accordance with Comparative Example 1-1.

FIG. 8 is a plan view that schematically shows an electrode structure of a surface acoustic wave device 800 relating to Comparative Example 1-1. The surface acoustic wave device 800 has a structure similar to that of the surface acoustic wave element 200 relating to the Second Embodiment. That is, the surface acoustic wave device 800 is provided with reflectors 8, 9 and 10, and in the same manner as in the first elastic wave surface element 14 of the surface acoustic wave device 200, the first surface acoustic wave element 814 is provided with three IDTs 2, 803 and 804, and in the same manner as in the second elastic wave surface element 15 of the surface acoustic wave device 200, the second surface acoustic wave element 815 is provided with three IDTs 805, 806 and 7. Here, different from the surface acoustic wave device 200, each of the first surface acoustic wave element 814 and the second surface acoustic wave element 815 is designed so that the adjacent electrode fingers between the adjoining IDTs as well as the adjacent electrode fingers between the adjoining IDT and reflector have polarities that are made asymmetrical with each other, centered on the IDT electrode 803 or 806 located in the center. In other words, each of the first surface acoustic wave element 814 and the second surface acoustic wave element 815 is designed so that the polarities of the electrode fingers that are adjacent to different IDTs or reflectors are made asymmetrical with each other centered on the IDT 803 or 806 located in the center. More specifically, in the first surface acoustic wave element 814, the polarities of the electrode fingers are indicated by G, G, S, S, G, G, S, G from the left side of FIG. 8, and in the second surface acoustic wave element 815, the polarities thereof are indicated by G, G, S, G, S, G, S, G from the left side of the Figure; thus, the polarities thereof are made asymmetrical with each other centered on the IDT 803, 806 located in the center.

The surface acoustic wave element 800 relating to Comparative Example 1-1 was manufactured in the same manner as in Example 1, and its characteristics were evaluated.

FIG. 9 is a drawing that shows frequency characteristics near the pass band (1930 MHz to 1990 MHz) of the surface acoustic wave devices relating to Example 1 and Comparative Example 1-1. FIG. 9 shows the frequency dependence of the insertion loss, which indicates transmission characteristics of the filter. The filter characteristics of the surface acoustic wave device relating to Example 1 were very good. More specifically, as shown in FIG. 9(*a*), no occurrence of fine ripples was observed within the pass band of the surface acoustic wave device relating to Example 1. That is, it was confirmed that a superior filter characteristic with a reduced insertion loss was obtained.

In contrast, as shown in FIG. 9(*b*), occurrence of fine ripples was observed within the pass band of the surface acoustic wave device relating to Comparative Example 1-1. That is, it was confirmed that the surface acoustic wave device relating to Comparative Example 1-1 had degradation in the insertion loss in comparison with Example 1.

Comparative Example 1-2

In Comparative Example 1-2, a surface acoustic wave device in which the number of electrode fingers connected to the unbalanced input/output terminal of the IDT in the center of each of the first and second surface acoustic wave elements was different from that of the surface acoustic wave device 200 relating to the Second Embodiment was manufactured in the same manner as in Example 1, and the characteristics thereof were evaluated.

FIG. 10 is a drawing that shows the degree of phase balance near the pass band (1930 MHz to 1990 MHz) of the surface acoustic wave device relating to each of Example 1 and Comparative Example 1-2. As shown in FIG. 10(*a*), the degree of phase balance of the surface acoustic wave device relating to Example 1 was flat in a stable manner within the pass band. That is, it was confirmed that in accordance with the surface acoustic wave device of Example 1, a very good characteristic of the degree of phase balance was obtained. In contrast, as shown in FIG. 10(*b*), it was confirmed that the degree of phase balance of the surface acoustic wave device of Comparative Example 1-2 was not stable within the pass band. In other words, it was confirmed that the surface acoustic wave device of Example 1 made it possible to greatly improve the degree of phase balance within the pass band.

Example 2

Based upon the structure of the surface acoustic wave device 100 relating to the First Embodiment, 16 kinds of surface acoustic wave devices, which had various different combinations of polarities of electrode fingers at portions having adjacent IDTs and different numbers of electrode fingers of the IDT located in the center, were manufactured in the same manner as in Example 1, and the presence or absence of occurrence of fine ripples within the pass band and the characteristic of the degree of phase balance were examined also in the same manner as in Example 1. Table 1 shows the results together with characteristics of the respective structures of the surface acoustic wave devices. Table 2 shows the structures of the respective 16 kinds of the surface acoustic wave devices in detail. Here, the polarities of the surface acoustic wave device 100 correspond to those of structure No 5 of Table 2. Moreover, with respect to the relationship of polarities of the elastic surface apparatuses 200, 300, 400, 500, 600 and 700, the polarities correspond to those of structure No. 5 of Table 2. Here, the polarities of the surface acoustic wave device of Comparative Example 1-1 correspond to No. 4, and the polarities of the surface acoustic wave device of Comparative Example 1-2 correspond to No. 7.

TABLE 1

| Structure No. | 1 | 2 | 3 | 4 | 5 | 6 | 7 | 8 |
|---|---|---|---|---|---|---|---|---|
| Relationship of polarities | Asymmetric | Asymmetric | Asymmetric | Asymmetric | Symmetric | Symmetric | Symmetric | Symmetric |
| Presence or absence of specified spike within pass band | Yes | Yes | Yes | Yes | No | No | No | No |
| Numbers of electrode fingers of two IDTs in the center | Same | Same | Same | Same | Same | Same | Different | Different |
| Characteristic of phase balance | Good | Good | Good | Good | Good | Good | Bad | Bad |

| Structure No. | 9 | 10 | 11 | 12 | 13 | 14 | 15 | 16 |
|---|---|---|---|---|---|---|---|---|
| Relationship of polarities | Symmetric | Symmetric | Symmetric | Symmetric | Asymmetric | Asymmetric | Asymmetric | Asymmetric |
| Presence or absence of specified spike within pass band | No | No | No | No | Yes | Yes | Yes | Yes |
| Numbers of electrode fingers of two IDTs in the center | Same | Same | Different | Different | Same | Same | Same | Same |
| Characteristic of phase balance | Good | Good | Bad | Bad | Good | Good | Good | Good |

TABLE 2

| Structure No. | | | 1 | 2 | 3 | 4 | 5 | 6 | 7 | 8 |
|---|---|---|---|---|---|---|---|---|---|---|
| Respective numbers of three IDT electrode fingers (Left side/Center/Right side) | | | 38 pcs/50 pcs/38 pcs | | | | 38 pcs/51 pcs/38 pcs | | | |
| First elastic surface face wave element | Number of electrode fingers connected to signal line of center IDT | | 25 pcs | | | | 26 pcs | | 25 pcs | |
| | Polarities of electrode fingers | | G | G | G | G | G | G | G | G |
| | | | S | G | S | G | G | S | S | G |
| | | | G | S | G | S | S | G | G | S |
| | | | G | S | S | G | S | G | G | S |
| | | | S | G | G | S | G | S | G | S |
| | | | S | G | S | G | S | G | G | S |
| | | | G | S | G | S | S | G | S | G |
| | | | G | G | G | G | G | G | G | G |
| Second elastic surface face wave element | Number of electrode fingers connected to signal line of center IDT | | 25 pcs | | | | 26 pcs | | 25 pcs | |
| | Polarities of electrode fingers | | G | G | G | G | G | G | G | G |
| | | | S | G | G | G | S | G | S | G |
| | | | G | S | G | S | G | S | G | S |
| | | | S | G | G | S | G | S | G | S |
| | | | G | S | S | G | S | G | S | G |
| | | | S | S | G | G | G | S | G | S |
| | | | G | S | G | S | S | G | S | G |
| | | | G | G | G | G | G | G | G | G |

| Structure No. | | | 9 | 10 | 11 | 12 | 13 | 14 | 15 | 16 |
|---|---|---|---|---|---|---|---|---|---|---|
| Respective numbers of three IDT electrode fingers (Left side/Center/Right side) | | | 39 pcs/51 pcs/39 pcs | | | | 39 pcs/50 pcs/39 pcs | | | |
| First elastic surface face wave element | Number of electrode fingers connected to signal line of center IDT | | 26 pcs | | | | 25 pcs | | 26 pcs | |
| | Polarities of electrode fingers | | G | G | G | G | G | G | G | G |
| | | | S | G | G | S | G | S | G | S |
| | | | S | G | G | S | G | S | G | S |
| | | | S | G | G | S | G | S | S | G |
| | | | S | G | G | S | S | G | G | S |
| | | | S | G | G | S | S | G | S | G |
| | | | S | G | G | S | S | G | S | G |
| | | | G | G | G | G | G | G | G | G |
| Second elastic surface face wave element | Number of electrode fingers connected to signal line of center IDT | | 26 pcs | | | | 26 pcs | | 26 pcs | |
| | Polarities of electrode fingers | | G | G | G | G | G | G | G | G |
| | | | G | S | G | S | G | S | G | S |
| | | | G | S | G | S | G | S | G | S |
| | | | S | G | S | G | S | G | G | S |
| | | | S | G | S | G | G | S | S | G |
| | | | G | S | G | S | S | G | S | G |
| | | | G | S | G | S | S | G | S | G |
| | | | G | G | G | G | G | G | G | G |

As shown in Table 1, in the surface acoustic wave devices relating to Nos. 5, 6, 9 and 10, the occurrence of fine ripples was suppressed and the degree of phase balance was improved. When the structures shown in Table 2 are taken into consideration in combination, it is said that the above-mentioned effects are obtained by providing structures that the polarities of the electrode fingers that are adjacent to each other between adjoining IDTs as well as of the electrode fingers that are adjacent to each other between the adjoining IDT and reflector are made symmetrical with one another centered on the IDT electrode in the center and that the first and second surface acoustic wave elements are designed so that the numbers of the electrode fingers connected to balanced input/output terminals in the IDT in the center are mutually made the same.

Example 3

The surface acoustic wave element 700 relating to the Seventh Embodiment was manufactured in the same manner as in Example 1, and its characteristics were evaluated.

FIG. 11 is a drawing that shows frequency characteristics near the pass band (1930 MHz to 1990 MHz). FIG. 11 shows the frequency dependence of the insertion loss, which indicates transmission characteristics of the filter. The filter characteristics of the surface acoustic wave device relating to Example 3 were very good. More specifically, as shown in FIG. 11, no occurrence of fine ripples was observed within the pass band of the surface acoustic wave device relating to Example 3. That is, it was confirmed that a superior filter characteristic with an improved insertion loss was obtained.

FIG. 12 is a drawing that shows the degree of balance near the pass band (1930 MHz to 1990 MHz) of the surface acoustic wave device relating to Example 3. As shown in FIG. 12(a), the degree of amplitude balance in the pass band of the surface acoustic wave device relating to Example 3 was flat within the pass band, which was a very desirable state. Here, as shown in FIG. 12(b), a comparatively good characteristic of the degree of phase balance was obtained.

That is, it was confirmed that by placing the grounded second reflectors between the electrode fingers that were connected to the signal terminals of the respective IDTs, with its electrode fingers being interpolated, the difference in amplitudes of the surface acoustic waves between the first and second surface acoustic wave elements could be made smaller to achieve a desired characteristic in the degree of amplitude balance.

Example 4-1

In this Example, the surface acoustic wave element 500 relating to the Fifth Embodiment was manufactured in the same manner as in Example 1, and its characteristics were evaluated.

Example 4-2

In this Example, the surface acoustic wave element 600 relating to the Sixth Embodiment was manufactured in the same manner as in Example 1, and its characteristics were evaluated.

Comparative Example 2

Figure 13:
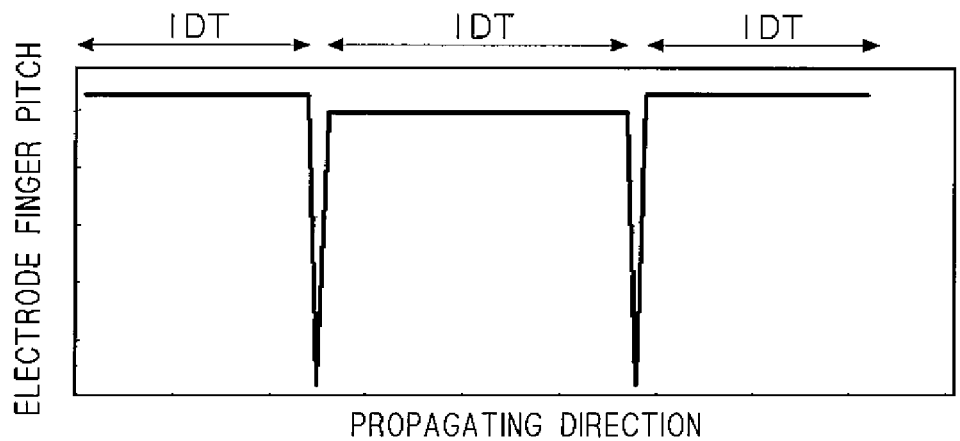
FIG. 13 is a drawing that shows variations in electrode finger pitches of a surface acoustic wave device according to Comparative Example 2.

FIG. 13 is a line drawing that shows variations in electrode finger pitches in the first and second surface acoustic wave elements in a surface acoustic wave device relating to Comparative Example 2. In Comparative Example 2, such a surface acoustic wave device was formed in the same manner as in Example 1, and its characteristics were evaluated. In FIG. 13, a portion that has a shorter electrode finger pitch between the IDTs corresponds to a gap of the electrode fingers at a portion having adjacent IDTs. Moreover, the surface acoustic wave device in accordance with Comparative Example 2 does not have the second reflector electrode, and although it has an electrode finger pitch different from that of the surface acoustic wave device relating to Example 4-1 and Example 4-2, it has the same structure as that of the surface acoustic wave device 500 relating to the Fifth Embodiment with respect to the other portions.

Figure 14:
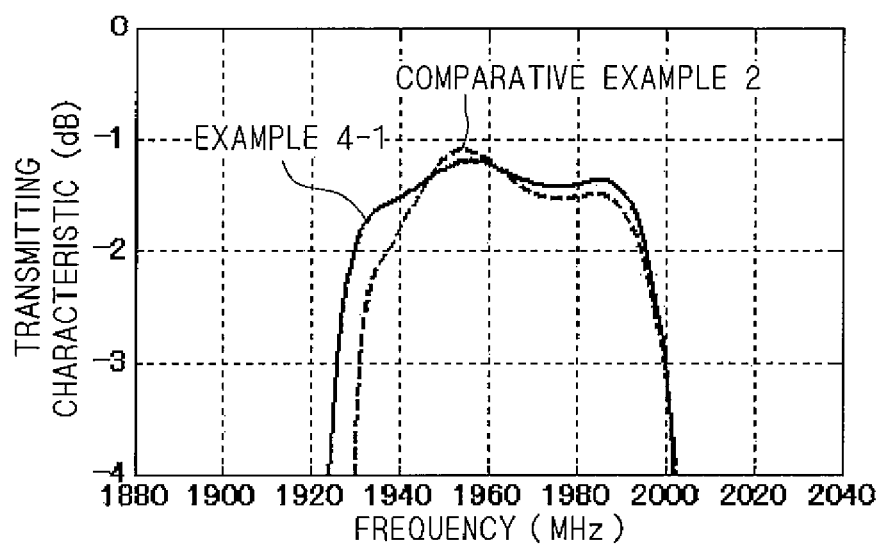
FIG. 14 is a drawing that shows frequency characteristics near pass bands of Example 4-1 and Comparative Example 2.

FIG. 14 is a drawing that shows frequency characteristics near the pass band of Example 4-1 and Comparative Example 2. FIG. 14 shows the frequency dependence of the insertion loss, which indicates transmission characteristics of the filter. As shown by FIG. 14, the filter characteristics of the surface acoustic wave device relating to Example 4-1 were very good. More specifically, no occurrence of fine ripples was observed within the pass band of the surface acoustic wave device relating to Example 4-1. Moreover, it was confirmed that a more desirable insertion loss was prepared in comparison with the filter characteristics of Comparative Example 2. Furthermore, it was also confirmed that a wider band was prepared with respect to the pass band. In this manner, it was confirmed that the surface acoustic wave device relating to Example 4-1 made it possible to restrain the occurrence of fine ripples in the pass band, and also to greatly improve the insertion loss.

Figure 15:
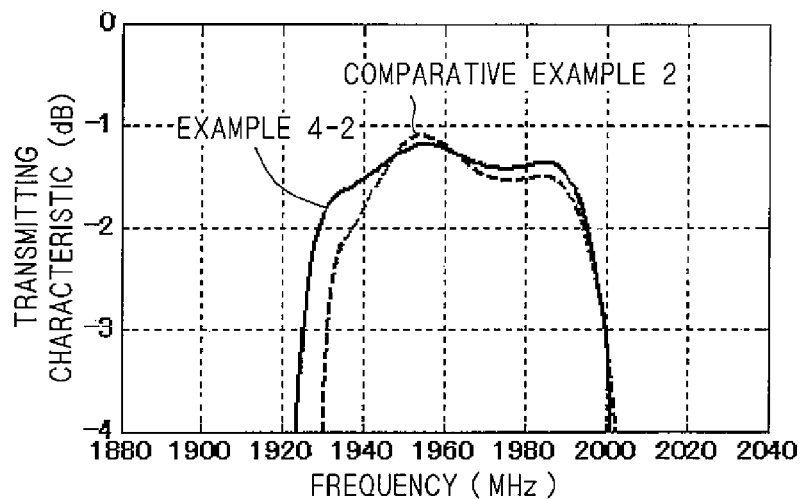
FIG. 15 is a drawing that shows frequency characteristics near pass bands of Example 4-2 and Comparative Example 2.

FIG. 15 is a drawing that shows frequency characteristics near the pass band of Example 4-2 and Comparative Example 2. FIG. 15 shows the frequency dependence of the insertion loss, which indicates transmission characteristics of the filter. As shown by FIG. 15, the filter characteristics of the surface acoustic wave device relating to Example 4-2 were also very good. More specifically, no occurrence of fine ripples was observed within the pass band of the surface acoustic wave device relating to Example 4-2 as well. Moreover, it was confirmed that a more desirable insertion loss was prepared in comparison with the filter characteristics of Comparative Example 2. Furthermore, it was also confirmed that a wider band was prepared with respect to the pass band. In this manner, it was confirmed that the surface acoustic wave device relating to Example 4-2 also made it possible to restrain the occurrence of fine ripples in the pass band, and also to greatly improve the insertion loss.

The invention claimed is:

1. A surface acoustic wave device, which has an unbalance/balance conversion function, comprising:
   a surface acoustic wave resonator to which an unbalanced input/output terminal is connected; and
   first and second surface acoustic wave elements parallel-connected to each other through said surface acoustic wave resonator, which are formed on a piezoelectric substrate,
   said first and second surface acoustic wave elements, each being provided with three or more odd-numbered IDTs placed along a propagation direction of a surface acoustic wave propagated over said piezoelectric substrate and provided with a plurality of electrode fingers the longitudinal direction of which is made orthogonal to the propagation direction, and
   first reflectors, placed on the two ends of an IDT row composed of said odd-numbered IDTs, each having a plurality of electrode fingers the longitudinal direction of which is made orthogonal to said propagation direction,
   with each of said first and second surface acoustic wave elements being provided with a balanced input/output terminal connected to the IDT in the center among said odd-numbered IDTs, wherein
   among electrode fingers possessed by said odd-numbered IDTs and said first reflector, the electrode fingers to which different one of said IDTs or said first reflectors is adjacent have polarities that are arranged symmetrically centered on said IDT in the center of said first or said second surface acoustic wave element,
   a second reflector composed of a plurality of electrode fingers the longitudinal direction of which is made orthogonal to said propagation direction are further placed between adjacent IDTs in said propagation direction among said odd-numbered IDTs,
   each of said first and second surface acoustic wave elements has a first portion in which electrode finger pitches vary along said propagation direction and a second portion in which said electrode finger pitches are constant,
   said first and second portions being arranged so that the average value of electrode finger pitches in said first portion is made shorter than that of the electrode finger pitches in said second portion, with the electrode finger pitch of said first portion being made shorter toward the border of the adjoining two IDTs, and the electrode finger pitch of said second reflector is made shorter than the electrode finger pitch of said second portion, and
   in said first and second surface acoustic wave elements, the electrode finger pitches in IDTs other than said IDT in the center among said odd-numbered IDTs have a maximum value so that a portion having a greater electrode finger pitch than the electrode finger pitch of said second portion is placed in said first portion.

2. The surface acoustic wave device according to claim 1, wherein said second reflector is grounded.

3. The surface acoustic wave device according to claim 1, wherein
one of said first reflectors in said first surface acoustic wave element and one of first reflectors in said second surface acoustic wave element are composed of a single reflector.

4. The surface acoustic wave device according to claim 1, wherein
in said first and second surface acoustic wave elements, the numbers of electrode fingers in said IDT in the center, connected to said balanced input/output terminal, are mutually the same.

5. The surface acoustic wave device according to claim 1, wherein
in said first and second surface acoustic wave elements, the number of electrode fingers in said IDT in the center is an odd number.

6. A communication apparatus, provided with a surface acoustic wave device in at least one of a receiving circuit and a transmitting circuit, said surface acoustic device comprising:
a surface acoustic wave resonator to which an unbalanced input/output terminal is connected; and
first and second surface acoustic wave elements parallel-connected to each other through said surface acoustic wave resonator, which are formed on a piezoelectric substrate,
said first and second surface acoustic wave elements, each being provided with three or more odd-numbered IDTs placed along a propagation direction of a surface acoustic wave propagated over said piezoelectric substrate and provided with a plurality of electrode fingers the longitudinal direction of which is made orthogonal to the propagation direction, and
first reflectors, placed on the two ends of an IDT row composed of said odd-numbered IDTs, each having a plurality of electrode fingers the longitudinal direction of which is made orthogonal to said propagation direction,
with each of said first and second surface acoustic wave elements being provided with a balanced input/output terminal connected to the IDT in the center among said odd-numbered IDTs, wherein
among electrode fingers possessed by said odd-numbered IDTs and said first reflector, the electrode fingers to which different one of said IDTs or said first reflectors is adjacent have polarities that are arranged symmetrically centered on said IDT in the center of said first or said second surface acoustic wave element,
a second reflector composed of a plurality of electrode fingers the longitudinal direction of which is made orthogonal to said propagation direction are further placed between adjacent IDTs in said propagation direction among said odd-numbered IDTs,
each of said first and second surface acoustic wave elements has a first portion in which electrode finger pitches vary along said propagation direction and a second portion in which said electrode finger pitches are constant,
said first and second portions being arranged so that the average value of electrode finger pitches in said first portion is made shorter than that of the electrode finger pitches in said second portion, with the electrode finger pitch of said first portion being made shorter toward the border of the adjoining two IDTs, and the electrode finger pitch of said second reflector is made shorter than the electrode finger pitch of said second portion, and
in said first and second surface acoustic wave elements, the electrode finger pitches in IDTs other than said IDT in the center among said odd-numbered IDTs have a maximum value so that a portion having a greater electrode finger pitch than the electrode finger pitch of said second portion is placed in said first portion.

7. The communication apparatus according to claim 6, comprising:
a transmitting circuit provided with:
a mixer that superposes a transmitting signal on a carrier signal to form an antenna transmitting signal;
a band pass filter that attenuates unnecessary signals of said antenna transmitting signal; and
a power amplifier that amplifies said antenna transmitting signal and outputs said amplified antenna transmitting signal to an antenna through a duplexer, wherein
said band pass filter is composed of said surface acoustic wave device.

8. The communication apparatus according to claim 6, comprising:
a receiving circuit provided with:
a low-noise amplifier that amplifies an antenna received signal that has been received by an antenna and allowed to pass through a duplexer;
a band pass filter that attenuates unnecessary signals of said amplified antenna received signal; and
a mixer that separates a received signal from a carrier signal of said antenna received signal, wherein
said band pass filter is composed of said surface acoustic wave device.

* * * * *